*(12)* United States Patent
Koshimizu et al.

(10) Patent No.: US 11,742,181 B2
(45) Date of Patent: Aug. 29, 2023

(54) CONTROL METHOD AND PLASMA PROCESSING APPARATUS

(71) Applicant: Tokyo Electron Limited, Tokyo (JP)

(72) Inventors: Chishio Koshimizu, Miyagi (JP); Taichi Hirano, Miyagi (JP); Toru Hayasaka, Miyagi (JP); Shinji Kubota, Miyagi (JP); Koji Maruyama, Miyagi (JP); Takashi Dokan, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 135 days.

(21) Appl. No.: 17/359,642

(22) Filed: Jun. 28, 2021

(65) Prior Publication Data

US 2021/0327681 A1  Oct. 21, 2021

Related U.S. Application Data

(63) Continuation of application No. 17/017,039, filed on Sep. 10, 2020, which is a continuation-in-part of (Continued)

(30) Foreign Application Priority Data

Jun. 22, 2018 (JP) .................................. 2018-119344
Jun. 5, 2019 (JP) .................................. 2019-105708

(51) Int. Cl.
*H01J 37/32* (2006.01)
*H01L 21/3065* (2006.01)

(52) U.S. Cl.
CPC .. *H01J 37/32128* (2013.01); *H01J 37/32146* (2013.01); *H01J 37/32165* (2013.01);
(Continued)

(58) Field of Classification Search
None
See application file for complete search history.

(56) References Cited

U.S. PATENT DOCUMENTS 5,779,925 A * 7/1998 Hashimoto ....... H01J 37/32137
438/758
5,928,528 A * 7/1999 Kubota ............ H01J 37/32706
257/E21.252
(Continued)

FOREIGN PATENT DOCUMENTS

JP  07-263413 A  10/1995
JP  09-092645 A   4/1997
(Continued)

OTHER PUBLICATIONS

International Search Report and Written Opinion dated Aug. 27, 2019 for PCT/JP2019/023238 filed on Jun. 12, 2019, 12 pages.

*Primary Examiner* — Srinivas Sathiraju
(74) *Attorney, Agent, or Firm* — XSENSUS LLP

(57) ABSTRACT

A control method of a plasma processing apparatus including a first electrode that places a workpiece thereon includes supplying a bias power to the first electrode, and supplying a source power having a frequency higher than that of the bias power into a plasma processing space. The source power has a first state and a second state. The control method further includes a first control process of alternately applying the first state and the second state of the source power in synchronization with a signal synchronized with a cycle of a radio frequency of the bias power, or a phase within one cycle of a reference electrical state that represents any one of a voltage, current, and electromagnetic field measured in a power feeding system of the bias power.

33 Claims, 23 Drawing Sheets

Related U.S. Application Data application No. PCT/JP2019/023238, filed on Jun. 12, 2019.

(52) U.S. Cl.
CPC .. *H01J 37/32174* (2013.01); *H01J 37/32532* (2013.01); *H01L 21/3065* (2013.01)

(56) References Cited

U.S. PATENT DOCUMENTS

| | | | | |
|---|---|---|---|---|
| 6,091,060 | A * | 7/2000 | Getchel | H01L 21/67248 118/725 |
| 6,558,564 | B1 * | 5/2003 | Loewenhardt | H01J 37/32082 216/68 |
| 7,588,947 | B2 * | 9/2009 | Yamazaki | G01R 31/129 257/E21.521 |
| 8,164,349 | B2 * | 4/2012 | Booth | H05H 1/0081 324/686 |
| 9,059,101 | B2 * | 6/2015 | Sato | H01L 22/00 |
| 9,870,898 | B2 * | 1/2018 | Urakawa | H01J 37/32146 |
| 10,134,570 | B2 * | 11/2018 | Sato | H01L 22/00 |
| 10,325,758 | B2 * | 6/2019 | Yamawaku | H01J 37/32119 |
| 10,553,465 | B2 * | 2/2020 | Augustyniak | H01L 21/67069 |
| 2005/0009347 | A1 * | 1/2005 | Matsumoto | H01J 37/32174 257/E21.252 |
| 2008/0105538 | A1 * | 5/2008 | Winterhalter | H05H 1/46 204/192.1 |
| 2009/0078678 | A1 * | 3/2009 | Kojima | H01L 21/31116 156/345.39 |
| 2009/0242135 | A1 * | 10/2009 | Koshimizu | H01J 37/32091 156/345.48 |
| 2009/0255800 | A1 * | 10/2009 | Koshimizu | H01J 37/32091 422/186.29 |
| 2010/0213171 | A1 * | 8/2010 | Koshimizu | H01J 37/32522 156/345.37 |
| 2010/0243606 | A1 * | 9/2010 | Koshimizu | H01J 37/32174 156/345.44 |
| 2010/0304572 | A1 * | 12/2010 | Koshimizu | H01J 37/32642 156/345.28 |
| 2011/0104902 | A1 * | 5/2011 | Yamazawa | H01J 37/3211 438/758 |
| 2011/0235675 | A1 * | 9/2011 | Matsudo | H01L 21/67248 374/E11.001 |
| 2012/0175063 | A1 * | 7/2012 | Yamawaku | H01L 21/67069 156/345.46 |
| 2012/0227955 | A1 * | 9/2012 | Koshimizu | H01L 21/67253 165/281 |
| 2014/0005665 | A1 * | 1/2014 | Konesky | A61B 18/10 606/41 |
| 2014/0256066 | A1 * | 9/2014 | Sato | H01L 21/3065 156/345.28 |
| 2015/0185092 | A1 * | 7/2015 | Koshimizu | G01K 17/20 374/29 |
| 2015/0248995 | A1 * | 9/2015 | Sato | H01J 37/3299 156/345.28 |
| 2015/0319838 | A1 * | 11/2015 | Bhutta | H04B 10/40 315/111.21 |
| 2016/0126064 | A1 * | 5/2016 | Yamawaku | H01J 37/3211 315/111.21 |
| 2016/0247666 | A1 * | 8/2016 | Urakawa | H01J 37/32715 |
| 2017/0062187 | A1 * | 3/2017 | Radomski | H01J 37/321 |
| 2018/0096822 | A1 * | 4/2018 | Urakawa | H01J 37/32715 |
| 2020/0118794 | A1 * | 4/2020 | Koshimizu | H01J 37/04 |
| 2020/0150164 | A1 * | 5/2020 | Ulrich | G01R 25/04 |
| 2020/0411286 | A1 * | 12/2020 | Koshimizu | H01J 37/32532 |
| 2020/0411289 | A1 * | 12/2020 | Radomski | H01J 37/32183 |
| 2021/0043472 | A1 * | 2/2021 | Koshimizu | H01J 37/32697 |
| 2021/0059037 | A1 * | 2/2021 | Ye | H01J 37/32935 |
| 2021/0090962 | A1 * | 3/2021 | Kapoor | H01L 22/26 |
| 2021/0175050 | A1 * | 6/2021 | Van Zyl | H01J 37/32165 |
| 2021/0327681 | A1 * | 10/2021 | Koshimizu | H01J 37/32091 |
| 2022/0216036 | A1 * | 7/2022 | Koshimizu | H01L 21/3065 |

FOREIGN PATENT DOCUMENTS

| | | |
|---|---|---|
| JP | 10-064915 A | 3/1998 |
| JP | 2009-071133 A | 4/2009 |
| JP | 2010-532549 A | 10/2010 |
| JP | 2014-179576 A | 9/2014 |
| JP | 2016-157735 A | 9/2016 |
| WO | 2017-040415 A | 3/2017 |
| WO | 2017/040515 A1 | 3/2017 |

* cited by examiner

CONTROL METHOD AND PLASMA PROCESSING APPARATUS

CROSS-REFERENCE TO RELATED APPLICATIONS

This application is a continuation application of U.S. application Ser. No. 17/017,039, filed on Sep. 10, 2020, which is a continuation-in-part of International Application No. PCT/JP2019/023238, filed on Jun. 12, 2019, which claims priority from Japanese Patent Application Nos. 2018-119344 and 2019-105708, filed on Jun. 22, 2018 and Jun. 5, 2019, respectively, all of which are incorporated herein in their entireties by reference.

TECHNICAL FIELD

The present disclosure relates to a control method and a plasma processing apparatus.

BACKGROUND

There is known a technology of making the etching rage of a polycrystalline silicon layer uniform, in which a radio-frequency power for drawing ions is applied in synchronization with ON/OFF of a radio-frequency power for generating plasma during an etching so as to cause the ions to reach a polycrystalline silicon layer (see, e.g., Japanese Patent Laid-open Publication No. 10-064915).

Japanese Patent Laid-open Publication No. 10-064915 controls the etching rate by applying radio-frequency powers of two different frequencies which include a source power that is a radio-frequency power for generating plasma and a bias power that is a radio-frequency power for drawing ions, to the inside of a processing container.

The present disclosure provides a technology of controlling the amount and quality of radicals and ions.

SUMMARY

An aspect of the present disclosure provides a control method of a plasma processing apparatus including a first electrode that places a workpiece thereon. The control method includes supplying a bias power to the first electrode, and supplying a source power having a frequency higher than that of the bias power into a plasma processing space. The source power has a first state and a second state. The control method further includes a first control process of alternately applying the first state and the second state of the source power in synchronization with a signal synchronized with a cycle of a radio frequency of the bias power, or a phase within one cycle of a reference electrical state that represents any one of a voltage, current, and electromagnetic field measured in a power feeding system of the bias power.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
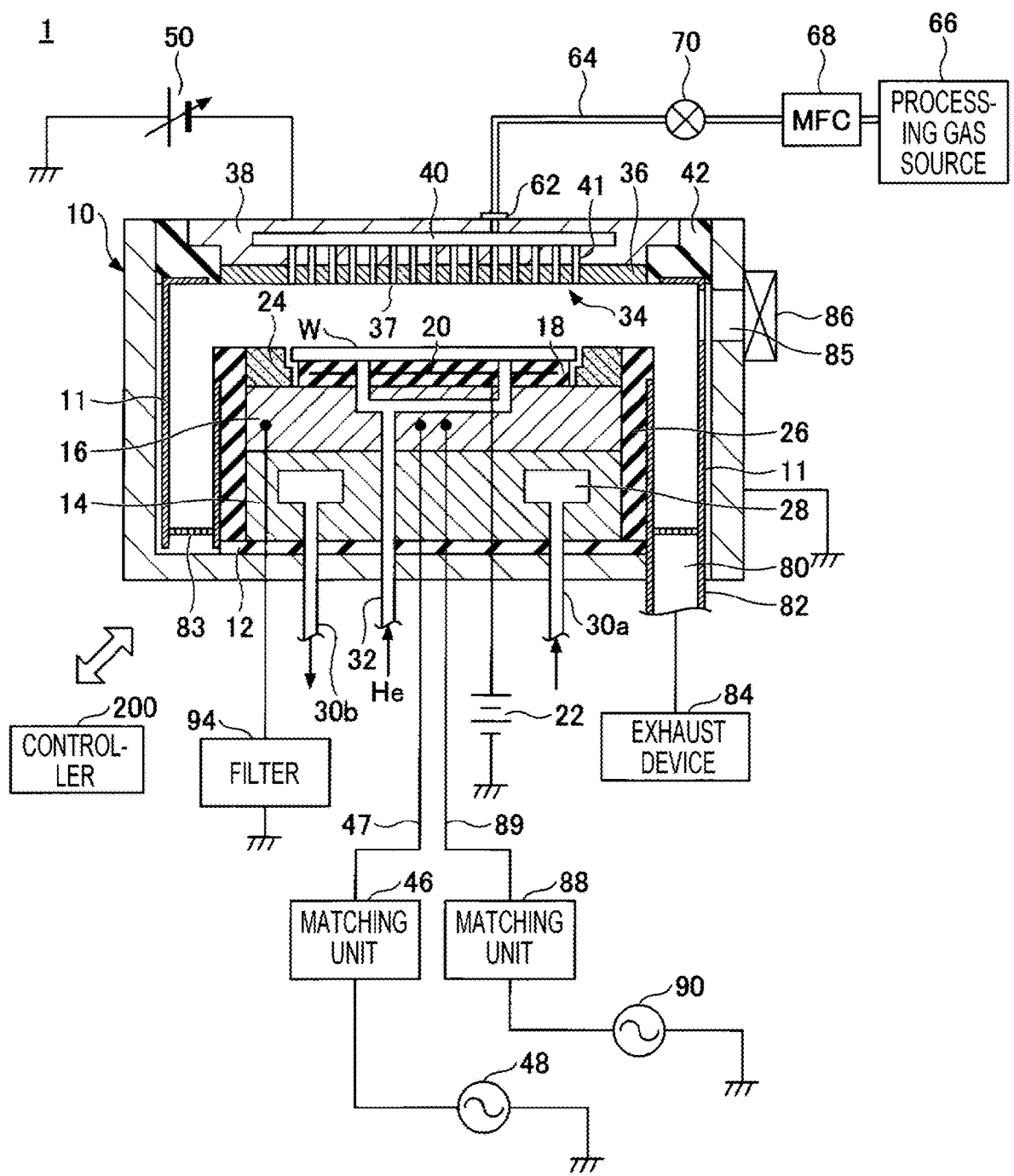
FIG. 1 is a view illustrating an example of a plasma processing apparatus according to an embodiment.

Embodiments for implementing the present disclosure will be described with reference to the drawings. In the descriptions and the drawings herein, components having a substantially similar configuration will be denoted by the same reference numerals, and overlapping descriptions thereof will be omitted.

Hereinafter, the frequency of the source power (radio frequency) may be referred to as "HF" (high frequency), and the source power may be referred to as the "HF power." The frequency of the bias power (radio frequency) which is lower than the frequency of the source power may be referred to as "LF" (low frequency), and the bias power may be referred to as the "LF power." In addition the bias power may be a fixed or variable DC voltage waveform.

[Introduction]

When radio-frequency powers of two different frequencies which include a source power that is a radio-frequency power for generating plasma and a bias power that is a radio-frequency power for drawing ions are applied to the inside of a processing container, an intermodulation distortion (IMD) may occur as a reflected wave power.

The IMD causes an occurrence of a matching defect, and due to the reflection characteristics, a radio-frequency power supply capable of inputting a power larger than an originally required radio-frequency power is necessary in order to maintain plasma. Thus, in order to reduce the occurrence of IMD, the related art optimizes the cable length of a coaxial cable which is used for a power feeding line of the radio-frequency power supply.

However, the IMD occurs at a frequency of the sum or subtraction of the fundamental wave and/or the harmonic wave of the HF power and the fundamental wave and/or the harmonic wave of the LF power. Thus, in the method of optimizing the cable length of the coaxial cable, a reflected wave power of a radio-frequency power of a certain frequency may be reduced, but a reflected wave power of another frequency generated from the sum or subtraction of the fundamental waves and/or the harmonic waves of the HF power and the LF power that are included in the IMD may not be eliminated.

Further, as the frequency of the LF power is relatively low, the IMD occurs at a frequency relatively close to the fundamental wave of the HF power. Thus, it may be conceived to increase the frequency of the LF power as much as possible, so as to suppress the occurrence of IMD at the frequency relatively close to the fundamental wave of the HF power. However, a satisfactory process result has been recently obtained when the frequency of the LF power is relatively low, especially, in an etching with a high aspect ratio. That is, since the etching rate decreases as a hole, with a high aspect ratio, is deeply etched, a control is performed to set the frequency of the LF power to a relatively lower frequency and to increase the power. As a result, the etching rate may be increased in the etching with a high aspect ratio. However, since the IMD further increases under this process condition, the reflected wave power of the radio-frequency power becomes high due to the high power and the relatively low frequency of the LF power. In particular, when the LF power and the HF power are applied to the same electrode, the reflected wave power of the radio-frequency power increases.

Figure 12:
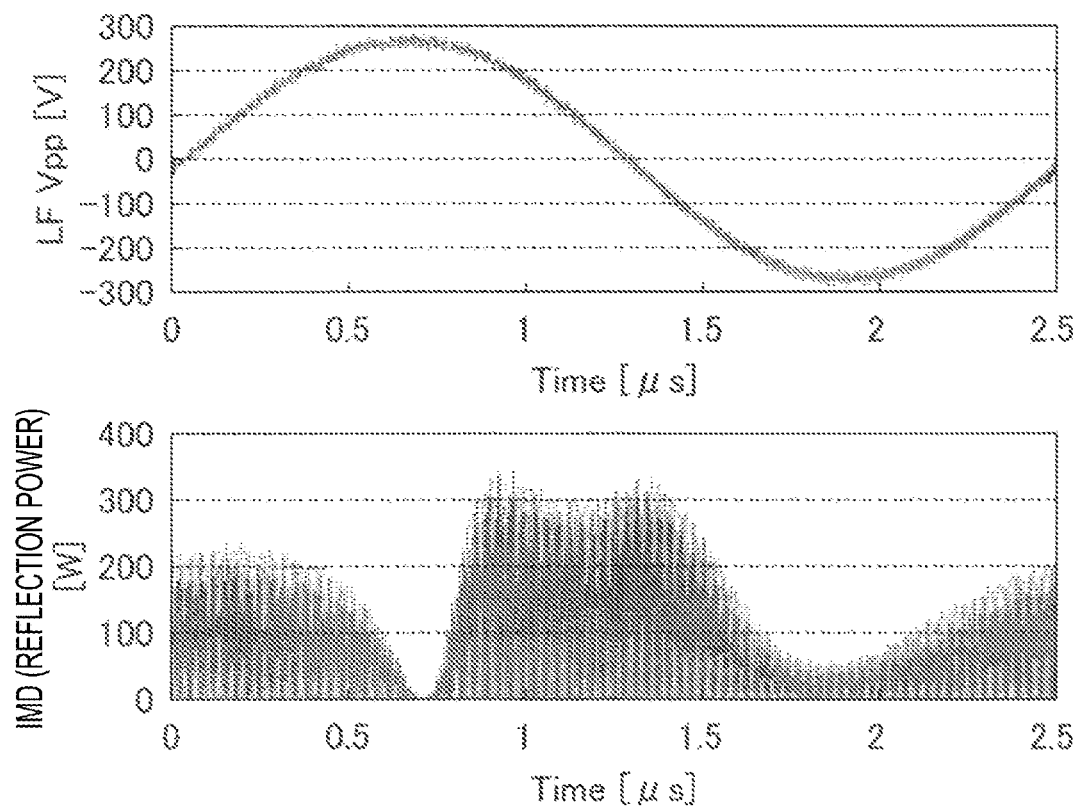
FIG. 12 is a view illustrating an example of an intermodulation distortion (IMD) according to the embodiment.

For example, FIG. 12 illustrates an example of a reflected wave power which is generated when the HF power of a predetermined frequency is applied to an electrode to which the LF power has been applied. The intensity of the IMD periodically varies in synchronization with the phase of LF Vpp (peak to peak). For example, in the example of FIG. 12, the IMD becomes substantially 0 W near the maximum positive value of the potential of LF, that is, no reflection occurs. The IMD is relatively low in the range in which the potential of LF is negative. The maximum reflected wave power is generated, and the IMD becomes maximum, over the range in which the potential of LF becomes negative after exceeding the maximum positive value.

In consideration of the timing when the IMD occurs, the inventors propose a control method of suppressing the occurrence of IMD according to the phase of LF and a plasma processing apparatus that executes the control method. Further, the inventors propose a control method of controlling the radio-frequency powers of the two different frequencies which include LF and HF, so as to control the amount and quality of radicals and ions.

[Entire Configuration of Plasma Processing Apparatus]

First, an example of a plasma processing apparatus 1 according to an embodiment will be described with reference to FIG. 1. FIG. 1 is a view illustrating an example of a plasma processing apparatus according to an embodiment.

The plasma processing apparatus 1 according to the embodiment is a capacitively coupled parallel plate plasma processing apparatus, and includes a cylindrical processing container 10 formed of, for example, aluminum with an anodized surface. The processing container 10 is grounded.

A columnar support 14 is disposed on the bottom of the processing container 10 via an insulating plate 12 made of ceramics or the like, and a stage 16 made of, for example, aluminum is provided on the support 14. The stage 16 makes up a lower electrode, and a wafer W which is an example of a workpiece is placed on the stage 16 via an electrostatic chuck 18.

The electrostatic chuck 18 is provided on the upper surface of the stage 16 to adsorb and hold the wafer W thereon by an electrostatic force. The electrostatic chuck 18 has a structure in which an electrode 20 made of a conductive film is sandwiched between a pair of insulating layers or insulating sheets. A DC power supply 22 is connected to the electrode 20. A DC voltage output from the DC power supply 22 is applied to the electrode 20. The wafer W is adsorbed and held on the electrostatic chuck 18 by the electrostatic force such as the Coulomb force generated by the application of the DC voltage.

A conductive edge ring 24 made of, for example, silicon is disposed at the periphery of the wafer W on the stage 12. The edge ring 24 may be referred to as a focus ring. A cylindrical inner wall member 26 made of, for example, quartz is provided on the lateral surfaces of the stage 16 and the support 14.

A coolant chamber 28 is provided, for example, in an annular shape inside the support 14. A coolant, for example, cooling water having a predetermined temperature is supplied in a circulative manner from a chiller unit provided outside to the coolant chamber 28 through pipes 30a and 30b, and the processing temperature of the wafer W on the stage 16 is controlled by the temperature of the coolant. The coolant is an example of a temperature adjustment medium that is supplied in a circulative manner to the pipes 30a and 30b, and the temperature adjustment medium may not only cool but also heat the stage 16 and the wafer W.

A heat transfer gas, for example, He gas is supplied between the upper surface of the electrostatic chuck 18 and the back surface of the wafer W from a heat transfer gas supply mechanism via a gas supply line 32.

An upper electrode 34 is provided above the stage 16 to face and be parallel with the stage 16. The space between the upper electrode 34 and the lower electrode serves as a plasma processing space. The upper electrode 34 forms a surface that faces the wafer W on the stage 16 and is in contact with the plasma processing space, that is, a facing surface.

The upper electrode 34 is supported on the upper portion of the processing container 10 via an insulating shielding member 42. The upper electrode 34 includes an electrode plate 36 that makes up the surface facing the stage 16 and is provided with a large number of gas injection holes 37, and an electrode support 38 that detachably supports the electrode plate 36 and is made of a conductive material, for example, aluminum with an anodized surface. The electrode plate 36 may be formed of, for example, silicon or SiC. A gas diffusion chamber 40 is provided inside the electrode support 38, and a large number of gas flow holes 41 extend downward from the gas diffusion chamber 40 to communicate with the gas injection holes 37.

A gas inlet port 62 is formed in the electrode support 38 to introduce a processing gas into the gas diffusion chamber 40, a gas supply pipe 64 is connected to the gas inlet port 62, and a processing gas source 66 is connected to the gas supply pipe 64. In the gas supply pipe 64, a mass flow controller (MFC) 68 and an opening/closing valve 70 are provided in this order from the upstream side. Then, a processing gas for an etching is supplied from the processing gas source 66. The processing gas reaches the gas diffusion chamber 40 from the gas supply pipe 64, and is injected in a shower form into the plasma processing space from the gas injection holes 37 through the gas flow holes 41. In this way, the upper electrode 34 functions as a shower head that supplies the processing gas.

A variable DC power supply 50 is connected to the upper electrode 34, and a DC voltage is applied from the variable DC power supply 50 to the upper electrode 34. A controller 200 controls the polarity and current/voltage of the variable DC power supply 50 and electronic switches for turning the current or voltage ON/OFF.

A first radio-frequency power supply 48 is connected to the stage 16 via a power feeding rod 47 and a matching unit 46. The first radio-frequency power supply 48 applies the LF power to the stage 16. As a result, ions are drawn into the wafer W on the stage 16. The first radio-frequency power supply 48 outputs a LF power having a frequency that falls within a range of 200 kHz to 13.56 MHz. The matching unit 46 matches the internal impedance of the first radio-frequency power supply 48 and a load impedance with each other.

A second radio-frequency power supply 90 is connected to the stage 16 via a power feeding rod 89 and a matching unit 88. The second radio-frequency power supply 90 applies the HF power to the stage 16. The frequency of HF is higher than the frequency of LF, and the second radio-frequency power supply 90 outputs an HF power having a frequency of 13.56 MHz or higher. For example, an HF power of 100 MHz which is higher than an LF power of 400 kHz may be output. The matching unit 88 matches the internal impedance of the second radio-frequency power supply 90 and a load impedance with each other. A filter 94 may be connected to the stage 16 to cause a predetermined radio frequency to pass through the ground. The HF power supplied from the second radio-frequency power supply 90 may be applied to the upper electrode 34.

An exhaust port 80 is provided in the bottom of the processing container 10, and an exhaust device 84 is connected to the exhaust port 80 via an exhaust pipe 82. The exhaust device 84 includes a vacuum pump such as a turbo molecular pump, and is able to reduce the pressure inside the processing container 10 to a desired degree of vacuum. A carry-in/out port 85 for the wafer W is provided in the side wall of the processing container 10, and is openable/closable by a gate valve 86. A deposit shield 11 is detachably provided along the inner wall of the processing container 10 to prevent etching by-products (deposits) from adhering to the processing container 10. That is, the deposit shield 11 makes up the wall of the processing container. The deposit shield 11 is also provided on the outer periphery of an inner wall member 26. An exhaust plate 83 is provided between the deposit shield 11 close to the wall of the processing container and the deposit shield 11 close to the inner wall member 26, at the bottom of the processing container 10. For the deposit shield 11 and the exhaust plate 83, an aluminum material coated with ceramics such as $Y_2O_3$ may be used.

When an etching is performed with the plasma processing apparatus 1 having the configuration described above, first, the gate valve 86 is brought into an open state, and the wafer W to be etched is carried into the processing container 10 through the carry-in/out port 85 and placed on the stage 16. Then, a processing gas for the etching is supplied from the processing gas source 66 to the gas diffusion chamber 40 at a predetermined flow rate, and supplied into the processing container 10 through the gas flow holes 41 and the gas injection holes 37. The inside of the processing container 10 is exhausted by the exhaust device 84, such that the pressure inside the processing container 10 becomes a set value within a range of, for example, 0.1 Pa to 150 Pa. Here, various gases that are used in related arts may be employed as the processing gas, and for example, a gas containing a halogen element such as $C_4F_8$ gas may be appropriately used. Other gases such as Ar gas and $O_2$ gas may be contained.

As described above, in a state where the etching gas is introduced into the processing container 10, the HF power is applied to the stage 16 from the second radio-frequency power supply 90. Further, the LF power is applied to the stage 16 from the first radio-frequency power supply 48. Further, the DC voltage from the variable DC power supply 50 is applied to the upper electrode 34. Further, the DC voltage from the DC power supply 22 is applied to the electrode 20, and the wafer W is held on the stage 16.

The processing gas injected from the gas injection holes 37 of the upper electrode 34 is dissociated and ionized mainly by the HF power, so that plasma is generated. The processing target surface of the wafer W is etched by radicals or ions in the plasma. By applying the LF power to the stage 16 so as to control the ions in the plasma, it is possible to broaden a plasma control margin such as enabling etching of a hole with a high aspect ratio.

The plasma processing apparatus 1 is provided with the controller 200 that controls the entire operation of the apparatus. The controller 200 executes desired plasma processing such as an etching, according to a recipe stored in a memory such as a read only memory (ROM) or a random access memory (RAM). In the recipe, for example, process time, a pressure (exhaust of gas), a radio-frequency power or voltage, flow rates of various gases, the temperature inside the processing container (e.g., the temperature of the upper electrode, the temperature of the side wall of the processing container, the temperature of the wafer W, and the temperature of the electrostatic chuck), and the temperature of the coolant output from the chiller are set as control information of the apparatus for process conditions. The recipe that represents the programs or process conditions may be stored in a hard disk or a semiconductor memory. The recipe may be set at a predetermined position in a portable computer-readable storage medium such as a CD-ROM or a DVD in a state of being stored in the medium, and may be read out therefrom.

ON/OFF or High/Low of the HF power may be controlled in synchronization with a signal synchronized with a cycle of a radio frequency of the bias power, or a phase within one cycle of any one of a voltage, current, and electromagnetic field measured in a power feeding system of the bias power. For example, the controller 200 may control ON/OFF or High/Low of the HF power to be synchronized with the phase within one cycle of the voltage or current of LF. As a result, the amount and quality of ions and radicals may be controlled. Further, the occurrence of IMD may be reduced.

The power feeding system of the bias power refers to the first radio-frequency power supply 48→the matching unit 46→the power feeding rod 47→the stage 16→(plasma)→the upper electrode 34→(ground). Any one of the voltage, current, and electromagnetic field measured in the power feeding system of the bias power refers to a voltage, current, or electromagnetic field measured in the portion from the first radio-frequency power supply 48 to the stage 16 through the inside of the matching unit 46 and the power feeding rod 47, and in the upper electrode 34.

The state of the signal synchronized with the cycle of the radio frequency of the bias power or any one of the voltage, current, and electromagnetic field measured in the power feeding system of the bias power may be referred to as a "reference electrical state." The HF power (source power) is controlled such that a first state and a second state to be described later are alternately applied in synchronization with the phase within one cycle of the reference electrical state.

When any one of the voltage, current, and electromagnetic field measured in the power feeding system of the bias power is the "reference electrical state," the reference electrical state may be a voltage, current or electromagnetic field measured in any one of the members from the stage 16 to the inside of the matching unit connected via the power feeding rod 47.

As the method of measuring the reference electrical state in the power feeding system of the bias power, there is, for example, a method of installing a voltage probe, a current probe or a BZ probe (a probe for measuring an induced magnetic field) near any one portion of the power feeding system of the bias power, and measuring a voltage, current or induced magnetic field of the portion.

Figure 2A:
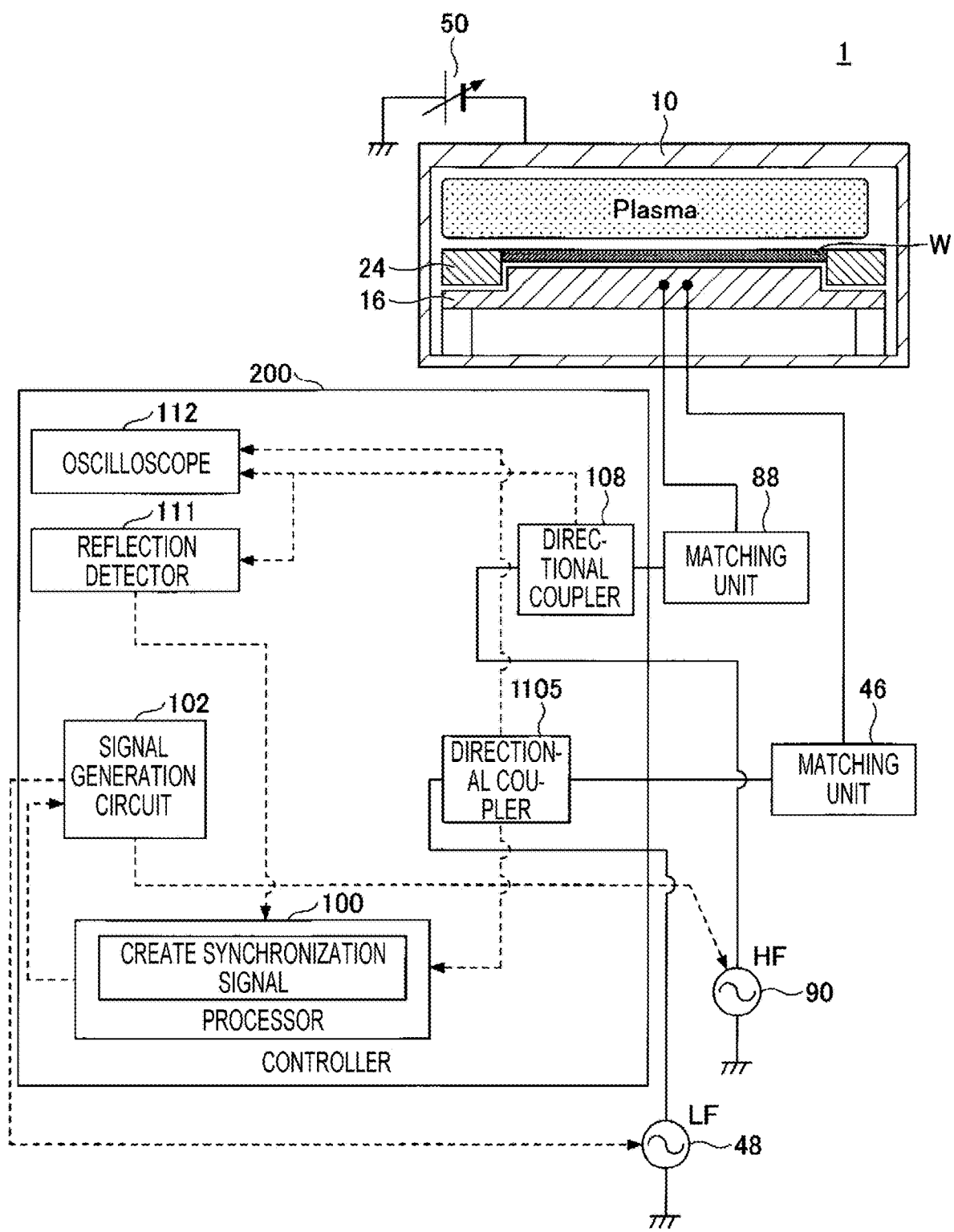
FIG. 2A is a view illustrating an example of a configuration of a controller according to the embodiment.
Figure 2B:
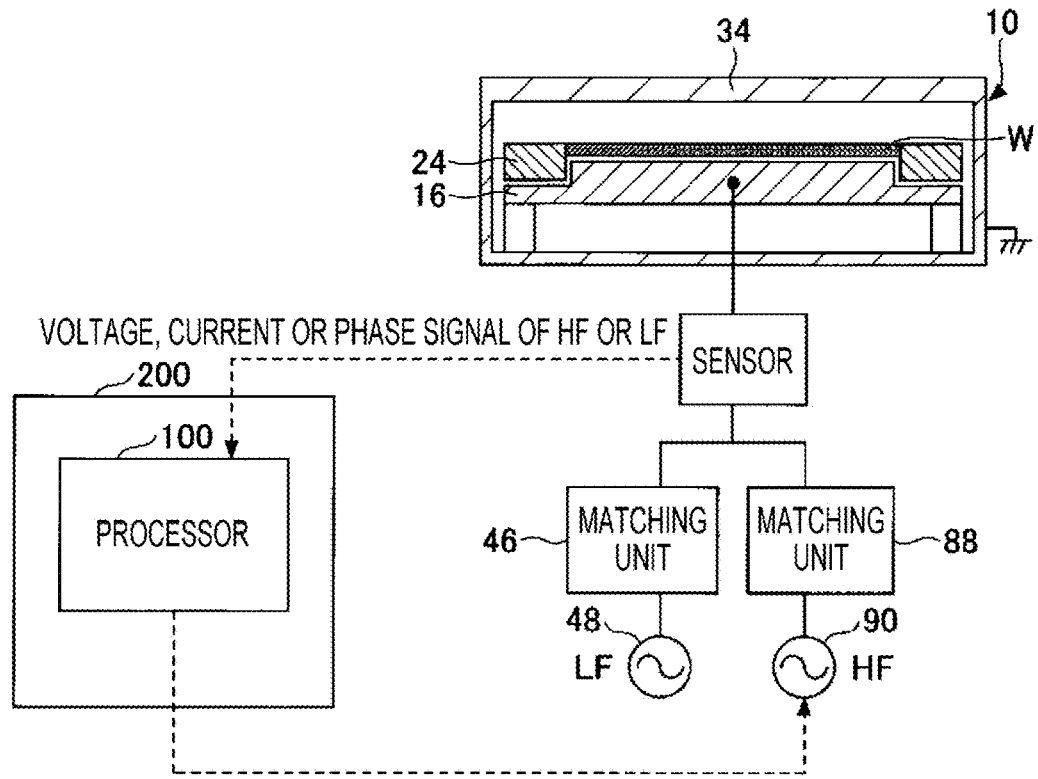
FIGS. 2B and 2C are views illustrating a case where a control is performed using a phase signal of a sensor attached to a power feeding system according to the embodiment, or a case where a control is performed using a signal synchronized with a cycle of a radio frequency of a bias power.

For example, FIG. 2B is an example of a case where the "reference electrical state" is any one of a voltage, current, and electromagnetic field measured in the power feeding system of the bias power. For example, in FIG. 2B, the processor 100 inputs any one of a voltage or current of HF, a voltage or current of LF, a phase signal of HF, and a phase signal of LF from a sensor such as a VI probe attached to the power feeding system. The processor 100 alternately applies the first state and the second state of the source power in synchronization with the phase within one cycle of the reference electrical state that represents any one of the input voltage or current of HF, voltage or current of LF, phase signal of HF, and phase signal of LF.

Figure 2C:
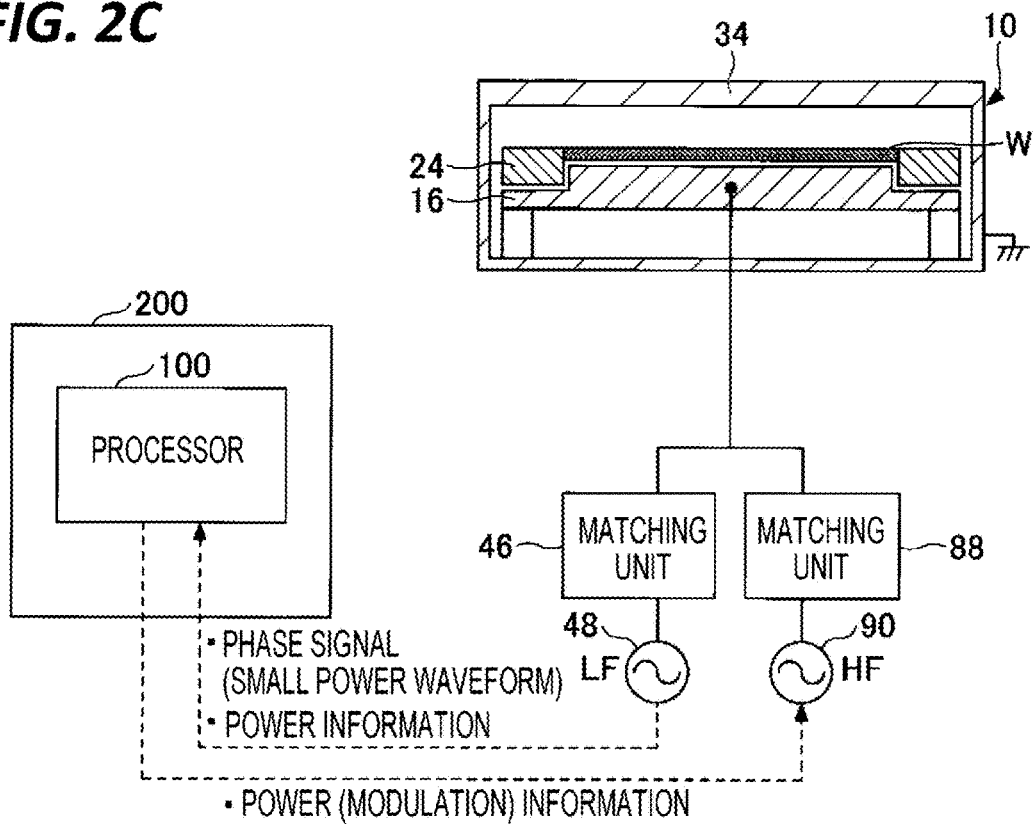

The processor 100 may generate a signal synchronized with the cycle of the radio frequency of the bias power output from the first radio-frequency power supply 48, without using the signal from the sensor. In this case, the state of the signal may be set as the reference electrical state. Further, the process of measuring the reference electrical state in the power feeding system of the bias power may be omitted. For example, in FIG. 2C, the processor 100 inputs a phase signal of LF (small power waveform) or a signal related to information of the bias power from the first radio-frequency power supply 48, and generates a signal synchronized with the cycle of the radio frequency of the bias power based on the input signal. The processor 100 outputs the generated signal to the second radio-frequency power supply 90. Based on this signal, the second radio-frequency power supply 90 alternately applies the first state and the second state of the source power.

The processor 100 may generate a signal synchronized with the cycle of the radio frequency of the bias power, without using the signal from the first radio-frequency power supply 48. In this case, the processor 100 generates, for example, a signal having the cycle represented by the LF of FIG. 3, and generates an ON/OFF signal represented by the HF of FIG. 3. The processor 100 outputs the generated signal to the first radio-frequency power supply 48 and the second radio-frequency power supply 90. Based on this signal, the first radio-frequency power supply 48 outputs the bias power. Based on this signal, the second radio-frequency power supply 90 alternately applies the first state and the second state of the source power.

The stage 16 is an example of a first electrode that places the wafer W thereon. The upper electrode is an example of a second electrode that faces the first electrode. The first radio-frequency power supply 48 is an example of a bias power supply that supplies the LF power to the first electrode. The second radio-frequency power supply 90 is an example of a source power supply that supplies the HF power having a frequency higher than the LF power, to the first or second electrode. The controller 200 is an example of a controller that controls the bias power supply and the source power supply. The potential of the lower electrode (the stage 16) to which the bias power is applied may be referred to as an electrode potential. In addition to the bias power being applied as a LF power (RF), it may also be applied as a DC voltage that is either fixed over time, or amplitude variable. An exemplary variable DC voltage waveform for the bias power is an ON/OFF modulated waveform (square wave) where a duty cycle of a high voltage pulse followed by a lower voltage pulse may vary from 100% (always on) to 1%, with a waveform period of 5 seconds per cycle to 1 msec/cycle. Alternatively, instead of square wave pulses (or rectangular pulses with only two voltage levels—high and low), the bias voltage waveform may have other shapes, such as triangular wave pulses defined by peak voltage, and ramp-up/ramp-down times, as well a saw-tooth waveforms.

[Configuration of Controller]

The specific configuration of the controller 200 will be described with reference to FIG. 2A. The controller 200 includes a processor 100, a signal generation circuit 102, directional couplers 105 and 108, a reflection detector 111, and an oscilloscope 112.

In the power feeding line of the first radio-frequency power supply 48, the directional coupler 105 is connected between the first radio-frequency power supply 48 and the matching unit 46. In the power feeding line of the second radio-frequency power supply 90, the directional coupler 108 is connected between the second radio-frequency power supply 90 and the matching unit 88.

The directional coupler 105 gives a portion of a traveling wave power Pf of LF to the oscilloscope 112. The directional coupler 108 gives a portion of a traveling wave power and a reflected wave power of HF to the oscilloscope 112.

In an embodiment, the frequency of LF displayed on the oscilloscope 112 is, for example, 400 kHz, and the frequency of HF displayed on the oscilloscope 112 is, for example, 100 MHz. Accordingly, the waveform of the traveling wave power of LF, and the waveforms of the traveling wave power and the reflected wave power of HF may be observed in the oscilloscope 112.

The directional coupler 108 separates a certain portion of the reflected wave of HF, and gives the separated portion to the reflection detector 111. The reflection detector 111 is configured by, for example, a spectrum analyzer, a power meter or the like, and measures a wavelength in which the IMD occurs, a degree of the occurring IMD or a degree of the reflected wave power. The IMD refers to a reflected wave power that occurs from plasma when the HF power is applied to the upper or lower electrode of the plasma processing apparatus 1 (the lower electrode in the embodiment), and the LF power is applied to the lower electrode, according to a frequency of the sum or subtraction of the fundamental wave and/or the harmonic wave of LF and the fundamental wave and/or the harmonic wave of HF.

The directional coupler 105 gives a portion of the traveling wave power of LF to the processor 100. The processor 100 creates an HF synchronization signal to be synchronized with the traveling wave power of LF. For example, the processor 100 may create the HF synchronization signal in synchronization with a positive timing of the traveling wave power of LF. Instead of the directional coupler 105, the waveform of LF detected using a sensor such as a VI probe or the like may be given to the processor 100.

The processor 100 gives the created synchronization signal to the signal generation circuit 102. The signal generation circuit 102 generates a control signal that is synchronized with the traveling wave power of LF from the given synchronization signal, and gives the generated control signal to the second radio-frequency power supply 90 and the first radio-frequency power supply 48.

There are two methods for generating the control signal as follows. In a case where the first radio-frequency power supply 48 is a general power supply, the directional coupler 105 takes out a portion of the voltage or current of LF output from the first radio-frequency power supply 48 as a waveform, and inputs the waveform to the processor 100. However, the present disclosure is not limited thereto, and the processor 100 may directly input a portion of the LF power or the like from the first radio-frequency power supply 48. The processor 100 creates an ON signal having an arbitrary delay and an arbitrary width from the signal of the input waveform, and transmits the ON signal to the signal generation circuit 102. The ON signal is an example of the synchronization signal.

The signal generation circuit 102 sends a command signal to the second radio-frequency power supply 90 in order to generate the HF power during the ON signal. As the command signal, a control signal for generating the HF power during the ON signal or the ON signal itself is used according to the input form of the second radio-frequency power supply 90.

In a case where the first radio-frequency power supply 48 is an amplifier that amplifies the LF power, voltage or current, the signal generation circuit 102 may take out a portion of the LF power or the like output from the first radio-frequency power supply 48 as a waveform, without using a signal from the directional coupler 105, and create an ON signal having an arbitrary delay and an arbitrary width from the signal of the waveform. The signal generation circuit 102 transmits the signal of the waveform and the ON signal to the second radio-frequency power supply 90.

The method of generating the control signal described above is an example, and is not limited thereto. As long as the control signal may be generated for controlling ON/OFF or High/Low of the HF power to be alternately applied in synchronization with the phase within one cycle of the reference electrical state (e.g., the phase within one cycle of the LF power or current, or the electrode potential) from the given synchronization signal, the present disclosure is not limited to the circuit of the controller 200 illustrated in FIG. 2A, and other hardware or software components may be used.

The amplifier of the first radio-frequency power supply 48 amplifies the amplitude of a modulation signal of LF of 400 kHz (amplitude modulation (AM)), and supplies the LF to the lower electrode. The amplifier of the second radio-frequency power supply 90 amplifies the amplitude of a modulation signal of HF of 100 MHz, and supplies the HF to the lower electrode.

Figure 3:
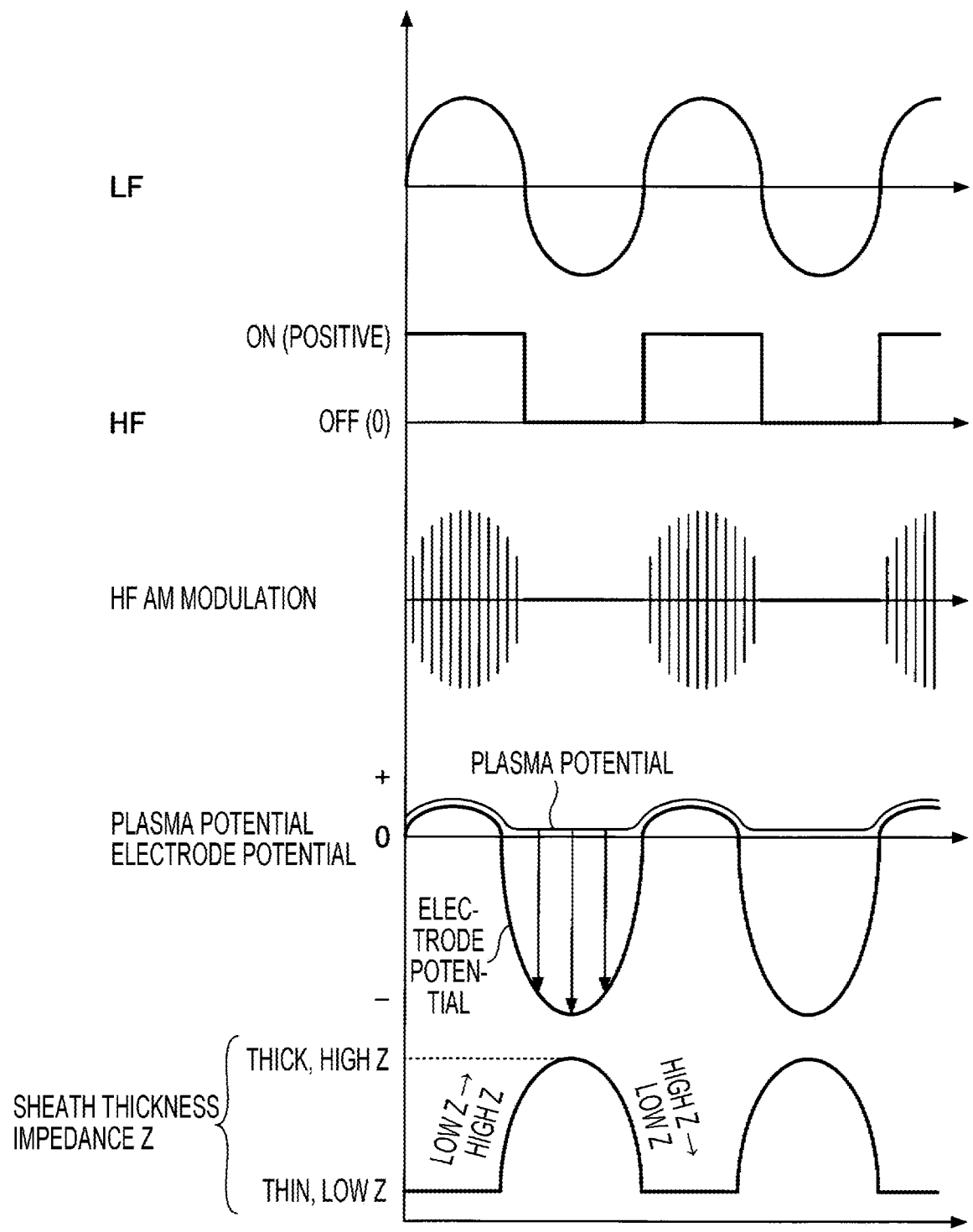
FIG. 3 is a view illustrating an example of a timing for supplying HF in accordance with a phase within one cycle of LF according to the embodiment.

FIG. 3 is a view illustrating an example of the waveform of the LF voltage or current, and the HF voltage or current applied at a timing when the LF voltage or current is positive. When the electrode potential represented in the second waveform from the bottom is positive, the HF voltage or current is controlled to be a positive value (turned ON). When the electrode potential is negative, the HF voltage or current is controlled to be 0 (turned OFF). Basically, since the electrode potential is determined by the LF voltage or current, the HF voltage or current is turned OFF at a timing when the LF voltage or current is negative, and turned ON at a timing when the LF voltage or current is positive.

The processor 100 may generate a synchronization signal for controlling the HF power during a time period including a timing when the electrode potential is positive. However, the processor 100 is not limited thereto, and may create a synchronization signal for controlling the HF power in a short time including a timing when the electrode potential becomes negatively deepest.

[Timing for Supplying HF Power]

Figure 4A:
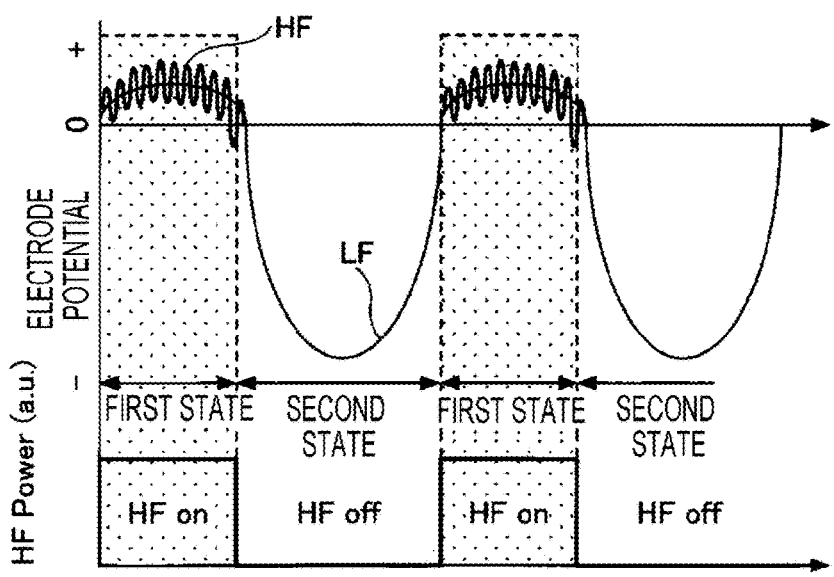
FIGS. 4A to 4C are views illustrating an example of a timing for supplying HF in accordance with a phase within one cycle of LF according to the embodiment.
Figure 4B:
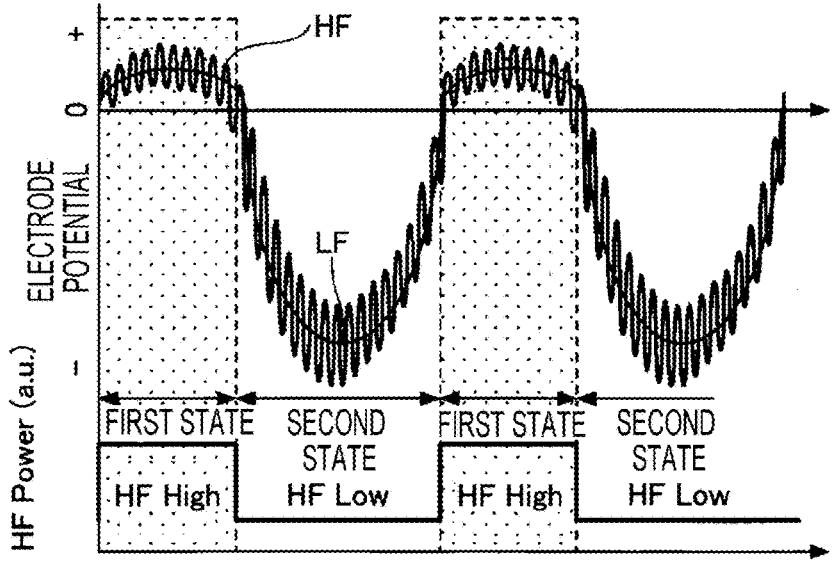
Figure 4C:
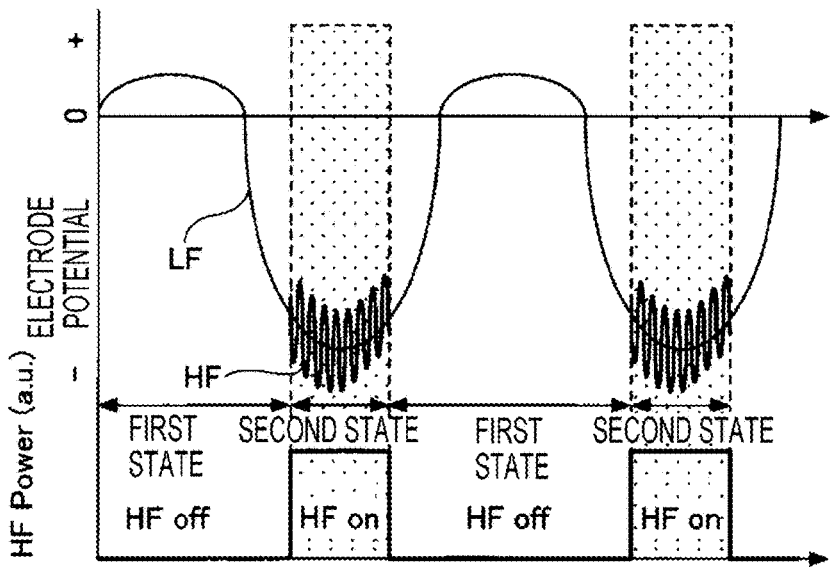

Next, the timing for supplying the HF power in an embodiment will be described with reference to FIGS. 4A to 4C. FIGS. 4A to 4C are views illustrating an example of the timing for supplying the HF power according to the embodiment.

In FIGS. 4A to 4C, the vertical axis represents the electrode potential. The electrode potential is substantially the same as the potential of the wafer. The electrode potential is a potential when the LF voltage and the HF voltage overlap with each other. Here, Vpp of the LF voltage having the LF frequency of 400 kHz is much larger than Vpp of the HF voltage having the HF frequency of 100 MHz. Thus, basically, the electrode potential is determined by the LF voltage, and vibrates with the width (amplitude) of Vpp of the HF voltage.

As for the sheath on the electrode as well, the sheath thickness is basically determined according to the LF voltage. The electrode potential when the LF voltage is negative becomes negatively deeper than the electrode potential when the LF voltage is positive, due to a so-called self-bias voltage Vdc. Since the electrode potential is close to the plasma potential when the electrode potential is positive with respect to the ground potential, a portion of high-flux electrons may flow into the electrode, and when the electrode potential is negative with respect to the ground potential, ions flow into the electrode.

Since the electrode is floating from the ground by a blocking capacitor (the matching unit in the embodiment), electrons that flow into the electrode do not flow to the ground. Accordingly, electrons flow to and are accumulated in the electrode in a certain cycle (half cycle) in which the surface of the electrode has the positive potential with respect to plasma. However, due to the accumulated electrons, the surface of the electrode is negatively charged, and a bias which is negative with respect to plasma is generated. Due to the negative bias, ions flow to the surface of the electrode. As a result, a sheath is formed on the surface of the electrode.

Finally, the surface of the electrode approaches the plasma potential, and when the electrons that flow to the electrode at this time and the ions that normally flow to the electrode by the negative bias are balanced, the DC component of the electrode potential is the self-bias voltage Vdc.

FIG. 3 schematically illustrates the electrode potential that corresponds to the phase of LF, the plasma potential that corresponds to the phase of LF, the sheath thickness, and the impedance Z. The plasma potential becomes slightly higher than the highest potential in the processing container 10. Accordingly, when the electrode potential is positive, the plasma potential becomes slightly higher than the electrode potential, and when the electrode potential is negative, and when the potential of the wall of the processing container 10 is 0, the plasma potential becomes slightly higher than the potential (0) of the wall.

In a case where the electrode potential becomes negatively deep due to the self-bias voltage Vdc when the LF voltage is negative, a large voltage is applied to the electrode when the electrode potential is negative since the sheath thickness is proportional to the voltage, and thus, the sheath thickness increases. Meanwhile, when the electrode potential is positive, a smaller voltage than that when the electrode potential is negative is applied to the electrode, and thus, the sheath thickness decreases.

In the embodiment, since the LF power and the HF power are applied to the stage 16 (the lower electrode), the electrode potential illustrated in FIGS. 4A to 4C corresponds to the potential of the lower electrode. In accordance with the phase of LF, there are a timing when the sheath on the stage 16 is thin and substantially flat, and a timing when the sheath is thick. Thus, assuming that the sheath is a capacitor, when the sheath is thin, the capacitance of the capacitor becomes large, and the impedance Z of the sheath becomes lower than the impedance $Z=1/\omega C$. That is, when the electrode potential is positive, the sheath is thin, and hence, the impedance Z is low and substantially constant. Meanwhile, when the electrode potential is negative, the sheath is thick, the impedance Z is high, and the variation thereof is large. Further, the impedance Z is substantially determined according to the LF voltage. Thus, it becomes difficult to match the impedance of the HF power. Especially, when the electrode potential is negative, that is, when the LF voltage is negative, the impedance is high, and the variation thereof is large. Thus, it becomes difficult to match the impedance of the HF power.

The matching unit 88 that matches the impedance of the HF power with respect to the variation of the impedance Z is able to follow up to a frequency of maximum about 1 Hz with the operation of a motor, but may have a difficulty in following a frequency higher than 1 Hz and takes a matching. Thus, the matching unit 88 may match the impedance of the HF power with one of timings of the impedance Z that varies every moment according to the phase of LF. In this state, since the matching unit 88 does not take a matching at phases other than the matched one timing, the reflected wave power of IMD is large.

Thus, in the embodiment, as illustrated in FIGS. 4A and 4B, when the electrode potential is positive, the HF power is controlled to be turned ON or High, and when the electrode potential is negative, the HF power is controlled to be turned OFF or Low.

In the embodiment, when the electrode potential is positive, the impedance Z is substantially constant, and hence, when the HF power is supplied at this timing, a matching may be easily taken. Thus, at this timing, the HF power is controlled to be turned ON or High. Meanwhile, when the electrode potential is negative, the impedance is high, and the variation thereof is large. Hence, it is difficult to take a matching even when the HF power is supplied at this timing. Thus, at this timing, the HF power is controlled to be turned OFF or Low. As a result, the occurrence of IMD may be reduced.

As illustrated in FIG. 4B, when the HF power is controlled to be High or Low, the HF power is not turned OFF and is maintained in the Low state at the timing when the electrode potential is negative, and thus, it is possible to suppress the decrease in plasma density, as compared to a case where the HF power is controlled to be turned ON or OFF. Further, the HF power applied at the timing when the electrode potential is negative is lower than the HF power applied at the timing when the electrode potential is positive, so that the occurrence of IMB may be suppressed.

The control method of controlling the HF power to be turned ON or High in synchronization with the timing when the electrode potential is positive is an example, and the present disclosure is not limited thereto. The HF power may be controlled to be turned ON or High when at least a portion of the phase of the reference electrical state is positive. Further, the HF power may be controlled to be turned ON or High when at least a portion of the phase of the reference electrical state is negative. That is, the HF power (the source power) may have a first state and a second state smaller than the first state, and the time period of the first state may include a timing at which the phase of the reference electrical state peaks. In this case, the peak may be a positive peak or a negative peak. Further, the time period of the first state may include a timing when at least a portion of the phase of the reference electrical state is positive. Further, the time period of the first state may include a timing when at least a portion of the phase of the reference electrical state is negative. As for the HF power, not only a rectangular wave that coincides with the timing when the phase of the reference electrical state is positive, but also a substantially rectangular wave including at least one of an ascending slow-up and a descending slow-down may be applied. The HF power may be applied at at least one of a timing shifted by a predetermined time after the timing when the phase of the reference electrical state is positive, and a timing shifted by a predetermined time before the timing when the phase of the reference electrical state is positive.

The following is an example of the control method where the HF power is applied at a timing shifted by a predetermined time from the timing when the phase of the reference electrical state is positive. In a case where the HF power is applied only when the phase of the reference electrical state is positive, the ion energy decreases. A process may require a relatively large ion energy according to a type of etching. In that case, the reference electrical state of LF goes into the negative phase from the positive phase, and the HF power is applied until ion energy of a desired magnitude is obtained. As a result, the process requiring the relatively large ion energy may be implemented.

The width of the time for supplying the HF power may be adjusted to be shortened or lengthened by a predetermined time, based on the timing when the phase of the reference electrical state is positive. For example, the HF power may be further supplied for a predetermined time before and after the timing when the phase of the reference electrical state is positive, in addition to the timing when the phase of the reference electrical state is positive.

The HF power may be supplied at the timing when the phase of the reference electrical state is negative. However, the impedance is relatively high and varies with time at the timing when the phase of the reference electrical state is negative. Accordingly, in this case, the HF power may be controlled to be turned ON for a relatively short time width which is the timing when the phase of the reference electrical state is negative. For example, the timing or width for applying the HF power may be adjusted with a circuit having a gate function or a delay function. The reflection intensity in one cycle of the reference electrical state may be measured in advance, and the HF power may be controlled using a circuit having an automatic adjustment function to apply the HF power at a timing when the reflection of the LF power is small in view of the measurement result.

For example, as illustrated in FIG. 4C, the HF power may be controlled to be turned ON or High for a relatively short time width that includes the time when the self-bias Vdc of the electrode becomes negatively the largest, at the timing when the electrode potential is negative, and may be controlled to be turned OFF or Low during the other time period. Further, the reflected wave power may be detected in advance, and according to the magnitude of the reflected wave power, the HF power may be controlled to be turned OFF or Low for a time when the reflected wave power is high, and may be controlled to be turned ON or High for a time when the reflected wave power is low. When the HF power is applied for the short time that corresponds to the time width including the time when the electrode potential illustrated in FIG. 4C becomes negatively the largest, it is possible to implement the injection of relatively strong ions in a certain etching such as HARC (high aspect ratio contact). As a result, the etching speed or the etching shape may be improved.

As described above, in the control method of the plasma processing apparatus 1 according to the embodiment, ON/OFF or High/Low of the HF power is controlled in synchronization with the phase within one cycle of the reference electrical state. As a result, the occurrence of IMD may be reduced. Further, the ion energy may be controlled, so that the amount and quality of radicals and ions may be controlled.

As illustrated in FIG. 3 and FIGS. 4A to 4C, the state where the HF power is controlled to be turned ON or High is an example of the first state, and the state where the HF power is controlled to be turned OFF or Low is an example of the second state.

The control method of the plasma processing apparatus 1 according to the embodiment includes a first control process of alternately applying the first state and the second state in synchronization with the phase within one cycle of the reference electrical state. The second state may be smaller than the first state, and the power of the second state may be 0 or a value smaller than the first state, other than 0.

[Example of Effects]

Next, descriptions will be made on an example of effects obtained from controlling ON/OFF or High/Low of the HF power in synchronization with the phase within one cycle of the reference electrical state, with reference to FIGS. 5 to 7.

Figure 5:
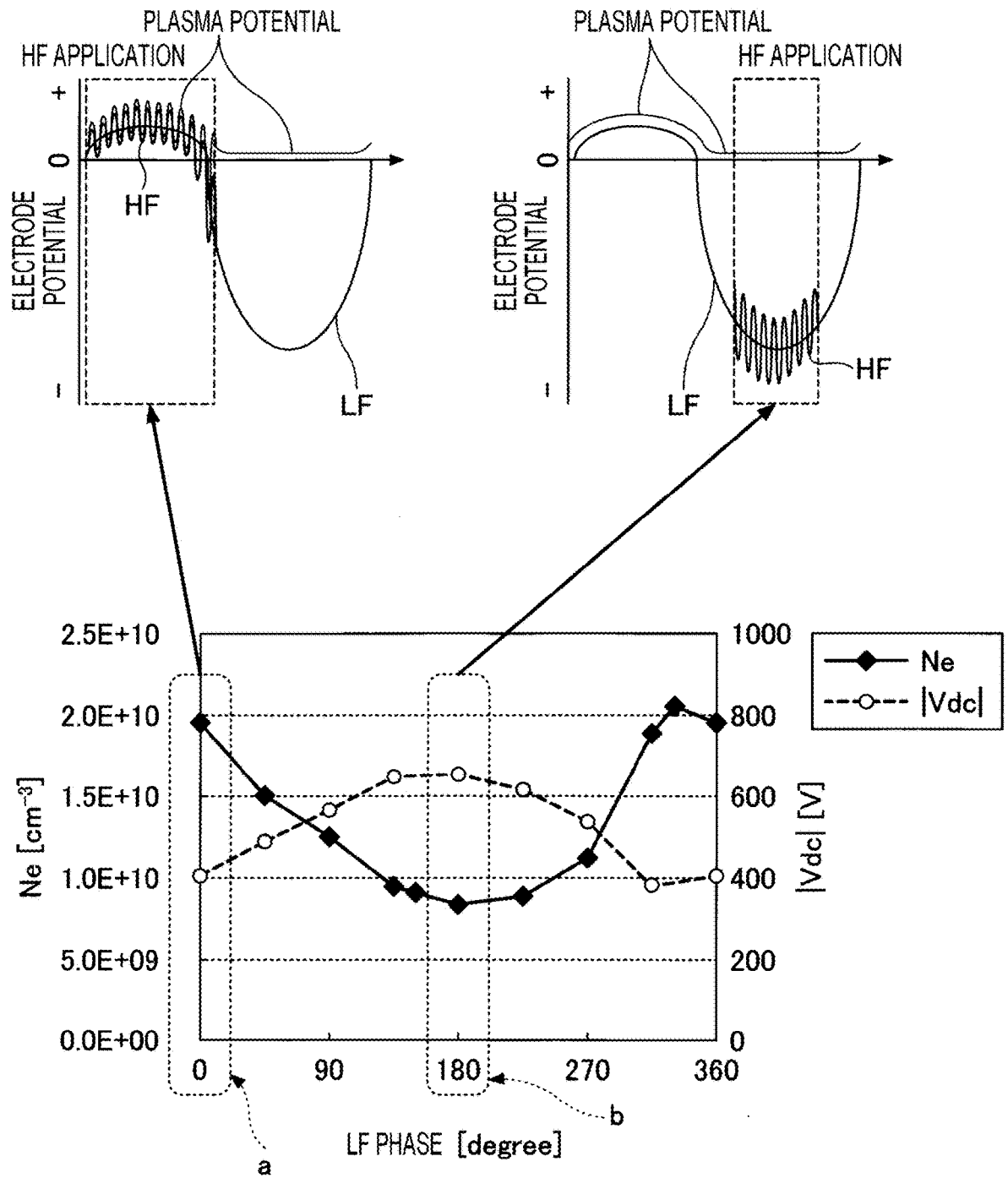
FIG. 5 is a view illustrating an example of a relationship among a phase within one cycle of LF, a plasma density Ne, and a self-bias Vdc according to the embodiment.

The graph of FIG. 5 illustrates an example of a relationship among the phase of LF, the plasma density Ne, and the absolute value of the self-bias |Vdc| according to the embodiment. FIGS. 6 and 7 are views illustrating an example of the reflected wave power according to the embodiment.

The graph of FIG. 5 illustrates an actual measurement result obtained by periodically applying the HF power for a time width of about 40% of one cycle of the reference electrical state, while changing the phase. The left vertical axis of the graph represents the plasma density Ne ($cm^{-3}$), and the right vertical axis of the graph represents the absolute value of the self-bias |Vdc|(V). When the HF power and the LF power are applied to the lower electrode of the plasma processing apparatus 1 while overlapping with each other, the sheath of the lower electrode varies in the cycle of LF. As a result, the impedance Z varies, and the plasma density Ne and the self-bias Vdc vary.

In a case where the HF power is turned ON at the timing when the electrode potential is positive and turned OFF at the timing when the electrode potential is negative (see the upper left diagram in FIG. 5), the plasma density Ne is high so that the plasma generation efficiency may be improved, as illustrated in the region "a" of the lower graph of FIG. 5. In the region "a," the absolute value of the self-bias |Vdc| is low so that the occurrence of IMD may be effectively suppressed.

In a case where the HF power is turned OFF at the timing when the electrode potential is positive and turned ON for the short time that includes the time when the electrode potential becomes negatively the largest (see the upper right diagram of FIG. 5), the plasma density Ne goes into the moderate-to-high level, and the plasma generation efficiency is moderate or higher, as illustrated in the region "b" of the lower graph of FIG. 5. This is because when the electrode potential is negative, a large voltage is applied to the electrode, and the sheath becomes thick, so that the electric field of HF decreases when the HF power is turned ON, and the plasma generation efficiency is lowered.

In the region "b," the absolute value of the self-bias |Vdc| is high, so that ions with the monochromatic ion energy, that is, the uniform ion energy may be drawn into the wafer W. Especially, in a process with a high aspect ratio, ions with the monochromatic high energy may be drawn into the wafer W. At this time, the occurrence of IMD may increase, but by applying the HF power for the short time when the potential of the lower electrode becomes negatively the largest, the total occurrence of IMD may be reduced, as compared to a case where the HF power is applied at all times.

As described above, in the plasma processing apparatus 1 according to the embodiment, the HF power is controlled to be turned ON or High based on, for example, the timing when the electrode potential is positive, so that the occurrence of IMD may be reduced. Further, in view of the problem in that the sheath becomes thick at the timing when the electrode potential is negative, and as a result, the plasma generation efficiency is lowered, the HF power is applied at the timing when the electrode potential is positive, so that the plasma generation efficiency may be improved.

By applying the HF power for only the short time that corresponds to the timing when the electrode potential is negatively the deepest, ions with the monochromatic high energy may be drawn into the wafer W.

Figure 6:
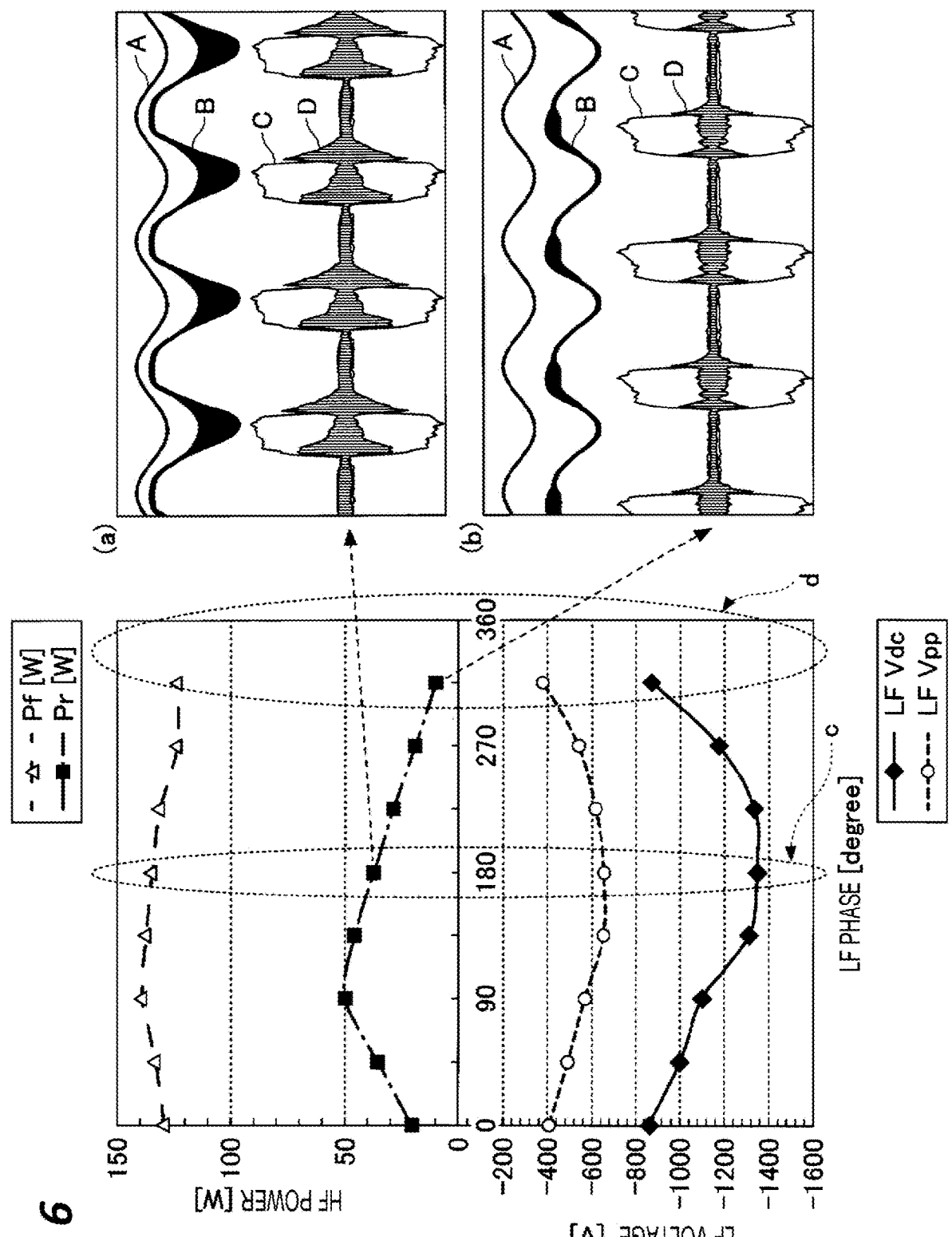
FIG. 6 is a view illustrating an example of a reflected wave power according to the embodiment.

For example, the left upper and lower graphs of FIG. 6 and the waveforms on the screens in (a) and (b) of the right portion of FIG. 6 represent the detection result obtained from the reflection detector 111 of the controller 200 and the display result in the oscilloscope 112. The left lower graph illustrates LF Vpp and LF Vdc in one cycle of LF. As Vdc is negatively deep, the sheath becomes thick, and as a result, the plasma generation efficiency when the HF power is applied is lowered. The left upper graph illustrates the traveling wave power Pf and the reflected wave power Pr of HF with respect to LF Vpp and LF Vdc in one cycle of LF.

The example of the display of the oscilloscope 112 in (a) of FIG. 6 represents a waveform A of the traveling wave power of LF measured when the phase of LF is 180° as illustrated in the region "c," and an amplitude B of the radio-frequency power on the wafer (i.e., a value of the sum of the LF power and the HF power). Further, "C" represents the waveform of the traveling wave power of HF, and "D" represents the waveform of the reflected wave power of HF. The example of the display of the oscilloscope 112 in (b) of FIG. 6 represents a waveform A of the traveling wave power of LF measured when the phase of LF is 0° (=360°) as illustrated in "d," an amplitude B of the radio-frequency power on the wafer, a waveform C of the traveling wave power of HF, and a waveform D of the reflected wave power of HF.

According to the results above, the reflected wave power in the region "d" is smaller than that in the region "c." Accordingly, it has been found that the occurrence of IMD may be suppressed by alternately applying the first state (e.g., the ON or High state) and the second state (e.g., the OFF or Low state) of the HF power, in synchronization with the signal synchronized with the cycle of the radio frequency of the bias power or the phase within one cycle of the reference electrical state measured in the power feeding system of the bias power, such that the phase of LF includes 0°. For example, as described above, the control according to the absolute value of the self-bias |Vdc| is performed in the manner that the HF power is controlled to go into the first state at the timing when the electrode potential is positive, and go into the second state at the timing when the electrode potential is negative, so that the IMD is suppressed, and the plasma generation efficiency may be improved. Further, when the HF power is controlled to go into the first state or the second state at an arbitrary timing according to the electrode potential, ions with the high energy may be drawn into the wafer W using the region where the plasma density Ne is high and the region where the absolute value of the self-bias |Vdc| is high. Further, in this case, the total occurrence of IMD may be reduced by applying the HF power in a pulse form.

Figure 7:
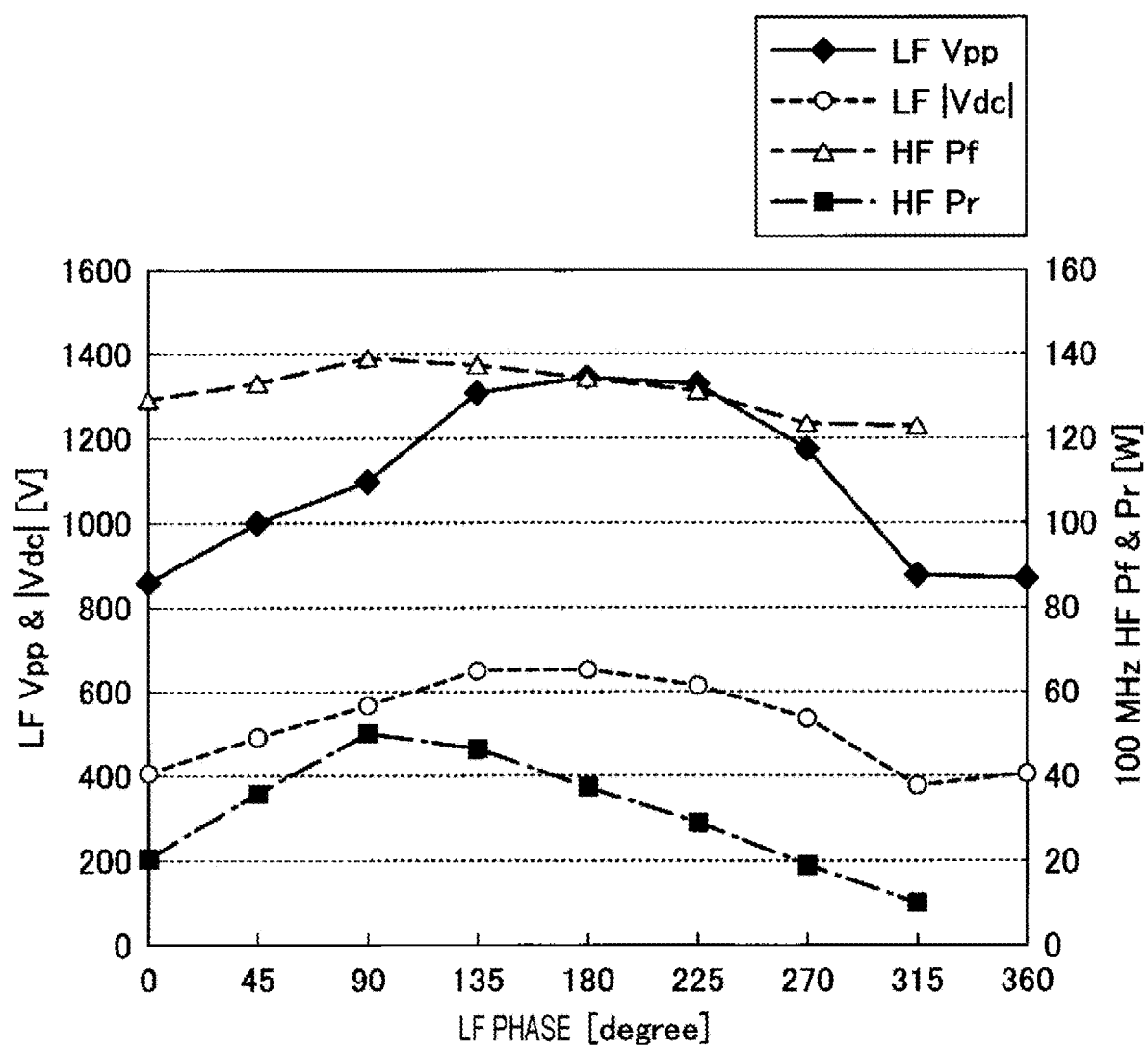
FIG. 7 is a view illustrating an example of a reflected wave power according to the embodiment.

FIG. 7 illustrates an example of LF Vpp, LF |Vdc|, the traveling wave power Pf of HF, and the reflected wave power Pr of HF. According to this example, the reflected wave power Pr of HF varies up to maximum about 5 times (from about 10 W to about 50 W) in the phase of one cycle of the LF voltage. Accordingly, when the HF power is controlled in synchronization with the phase within one cycle of the reference electrical state, the IMD may be reduced to about ⅕. Further, it has been found that each of LF Vpp and LF |Vdc| may also be changed in the range in which the minimum value varies up to maximum about 1.6 times, by controlling the HF power in synchronization with the phase within one cycle of the reference electrical state.

[Modifications]

Figure 8A:
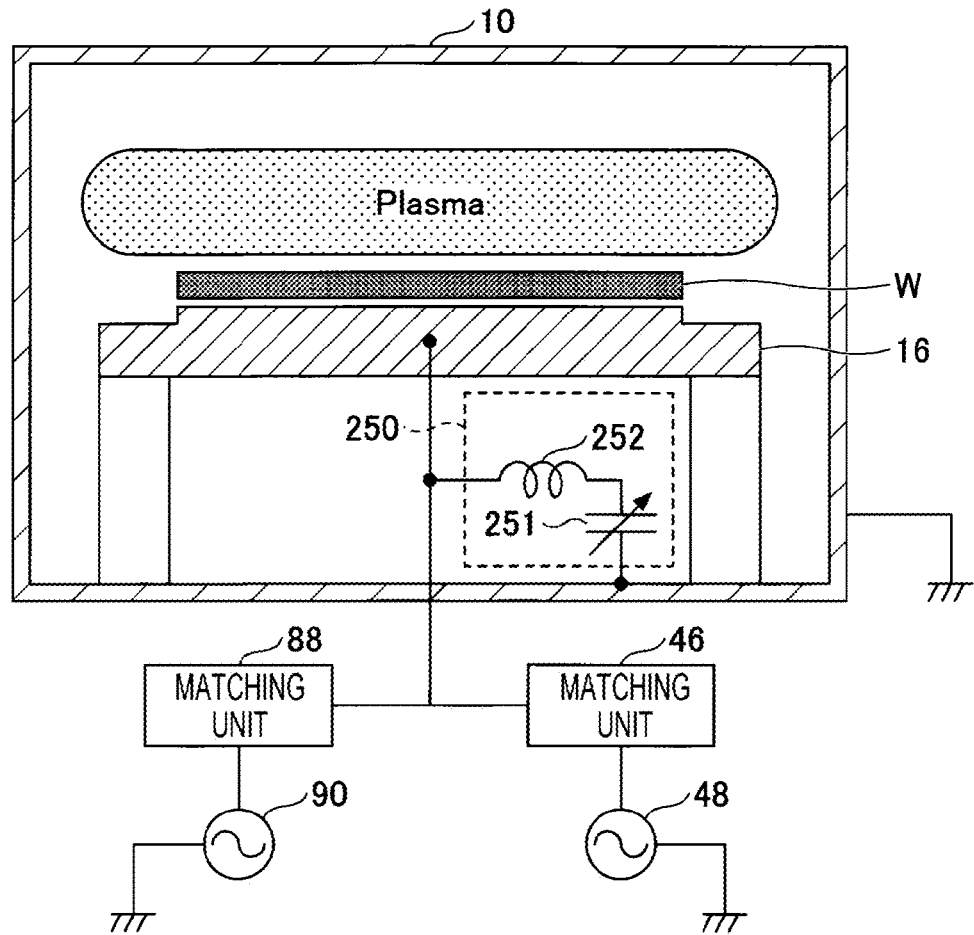
FIGS. 8A and 8B are views illustrating a control method according to Modification 1 of the embodiment.
Figure 8B:
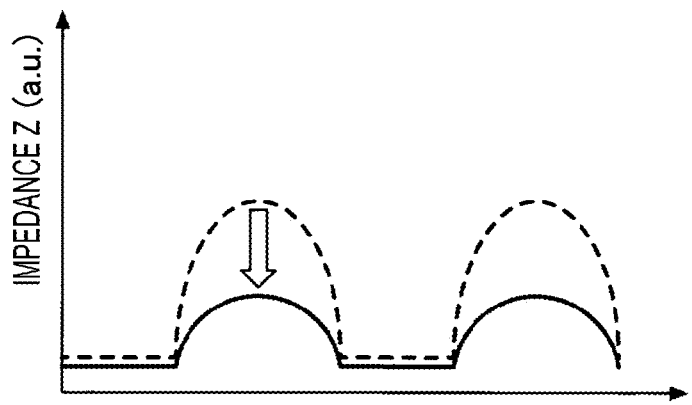
Figure 9A:
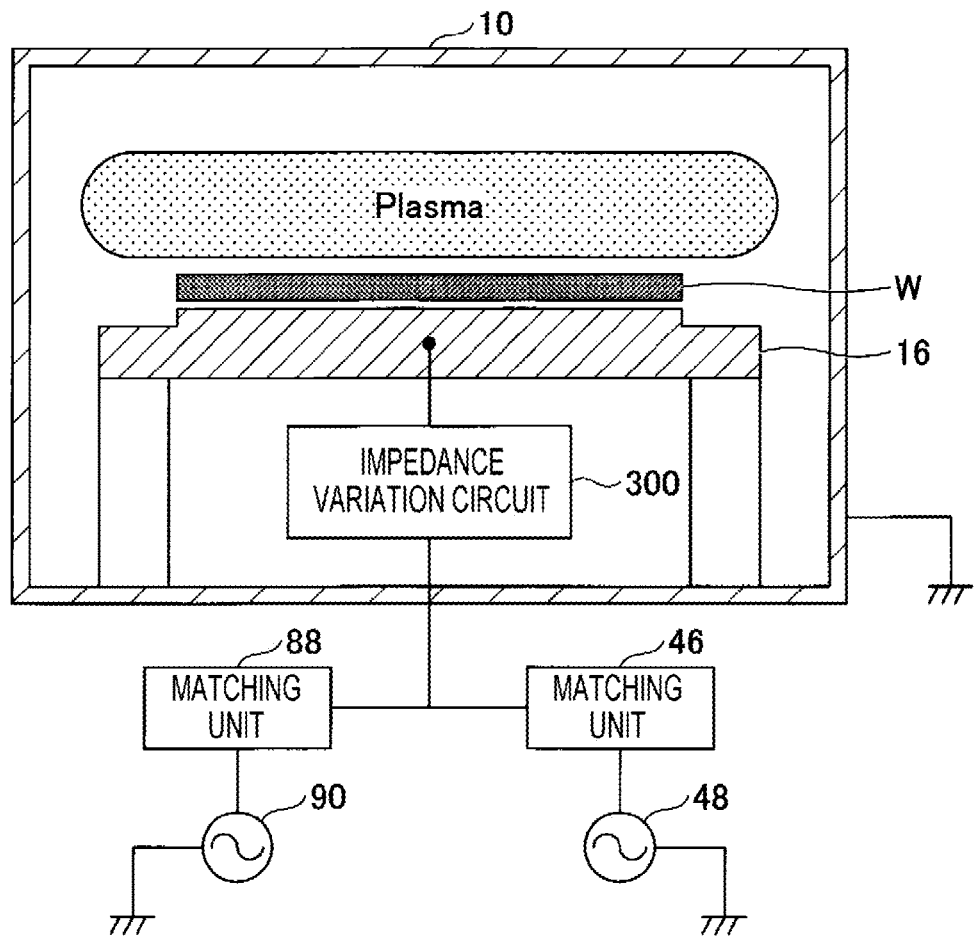
FIGS. 9A and 9B are views illustrating a control method according to Modification 2 of the embodiment.
Figure 9B:
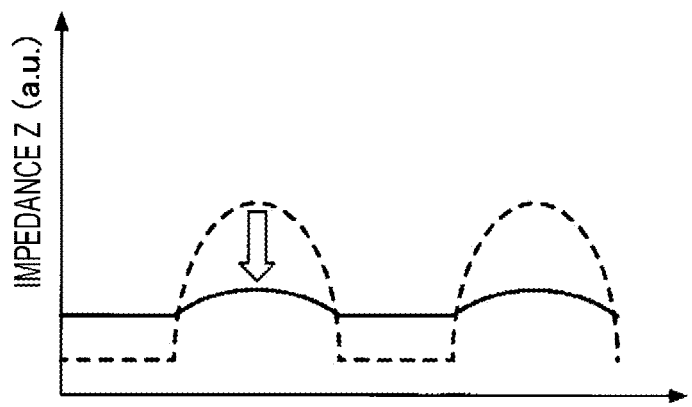
Figure 10A:
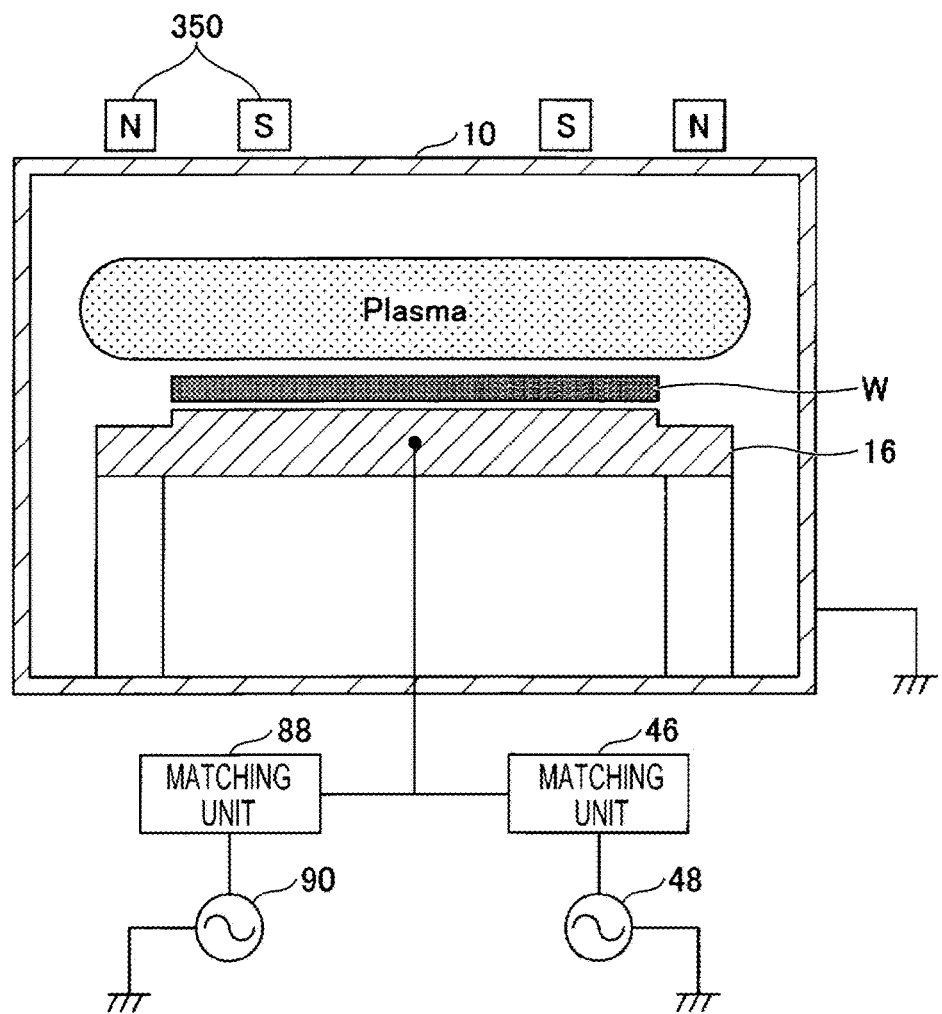
FIGS. 10A and 10B are views illustrating a control method according to Modification 3 of the embodiment.
Figure 10B:
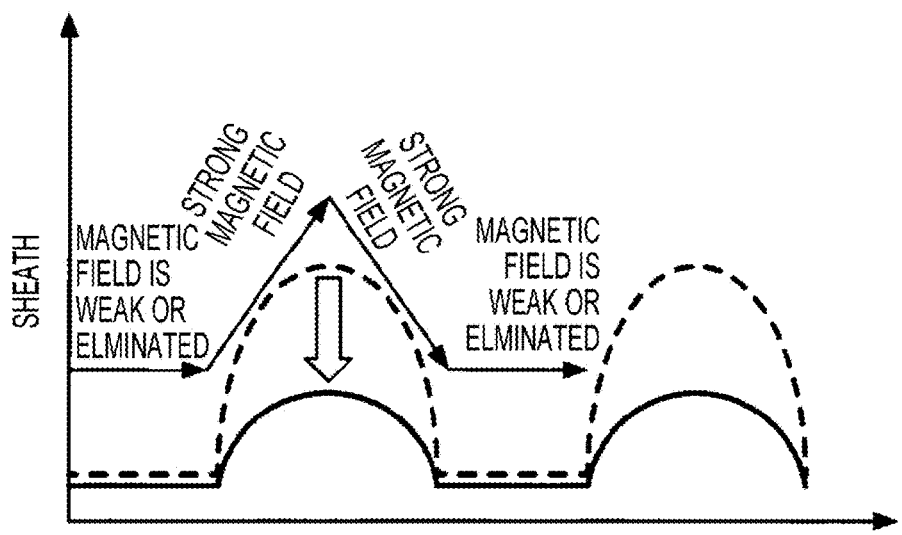
Figure 11A:
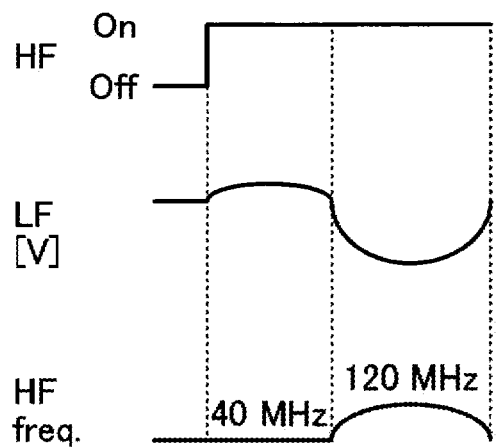
FIGS. 11A and 11B are views illustrating a control method according to Modification 4 of the embodiment.
Figure 11B:
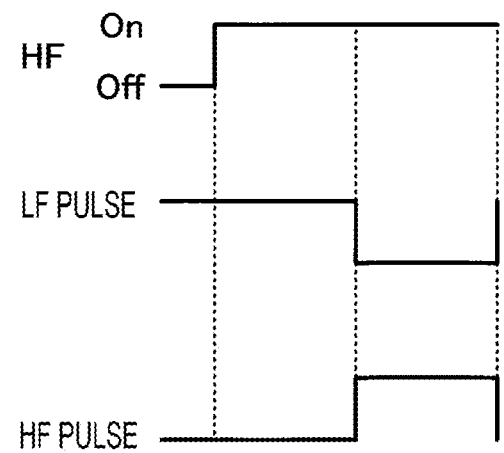

Next, control methods according to Modifications 1 to 4 of the embodiment will be described with reference to FIGS. 8A to 11B. FIGS. 8A and 8B are views illustrating the control method according to Modification 1 of the embodiment. FIGS. 9A and 9B are views illustrating the control method according to Modification 2 of the embodiment. FIGS. 10A and 10B are views illustrating the control method according to Modification 3 of the embodiment. FIGS. 11A and 11B are views illustrating the control method according to Modification 4 of the embodiment.

(Modification 1)

In the embodiment described above, when the HF power is pulse-modulated (see the HF AM modulation in FIG. 3) in synchronization with the phase within one cycle of the reference electrical state, an HF power supply may be required to pulse-modulate the HF power with the same frequency as the frequency of LF, thereby increasing costs.

Thus, in the plasma processing apparatus 1 according to Modification 1, as illustrated in FIG. 8A, an additional circuit 250 that makes up a bypass line is attached to the power feeding line connected to the first radio-frequency power supply 48 and the second radio-frequency power supply 90, or the lower electrode. In the additional circuit 250, a coil 252 and a variable capacitor 251 are connected in series to the power feeding rod connected to the lower electrode, and the variable capacitor 251 is connected to the processing container 10 and is grounded.

The ratio of the impedance on the side of the processing container 10 to the load impedance on the side of plasma is represented to be relatively large with the additional circuit 250, so that even when the impedance varies, the additional circuit 250 may mitigate a large variation of the impedance Z which is the sum of the impedances of the additional circuit 250 and the processing container 10, as compared to a case where the additional circuit 250 is not provided. For example, as illustrated in FIG. 8B, the variation of the summed impedance Z is reduced by the additional circuit 250, so that when the HF power is applied in synchronization with the phase within one cycle of the reference electrical state, the occurrence of IMD may be further suppressed. Further, the structure for suppressing the IMD may be simply constructed at low costs, by only attaching the additional circuit 250. Further, the additional circuit 250 is preferable because the HF power is hardly affected by the LF power when the power feeding rod is branched and inserted into the second radio-frequency power supply 90. When a filter is provided between the first radio-frequency power supply 48 and the second radio-frequency power supply 90, the HF power is further hardly affected by the LF power, so that the variation of the summed impedance Z may be reduced, and the occurrence of IMD is further suppressed. The additional circuit 250 may include at least one element of a coil, a capacitor, and a diode.

(Modification 2)

In the plasma processing apparatus 1 according to Modification 2, as illustrated in FIG. 9A, an impedance variation circuit 300 is attached to the power feeding line connected to the first radio-frequency power supply 48 and the second radio-frequency power supply 90, or the lower electrode. The impedance variation circuit 300 functions to change the impedance such that a combined impedance of the load impedance on the side of plasma and the impedance of the impedance variation circuit 300 becomes constant. Alternatively, the impedance variation circuit 300 changes the impedance according to the phase of LF, so as to suppress the variation of the impedance viewed from the matching unit 88. As a result, the reflected wave power may be suppressed, and the occurrence of IMD may be reduced. The impedance variation circuit 300 changes the impedance within one cycle of the reference electrical state according to the phase (or impedance) of LF, Vdc of LF, the reflected wave power of LF or the like, thereby suppressing the IMD.

An example of the impedance variation circuit 300 may have a configuration where capacitors are provided in an array form, and the connection of the capacitors is switched by an electronic switch. The controller 200 controls the electronic switch to change the impedance of the impedance variation circuit 300.

For example, as illustrated in FIG. 9B, the controller 200 switches the connection of the capacitors of the impedance variation circuit 300, so as to reduce the variation of the impedance Z which is the sum of the load impedance on the side of plasma and the impedance of the impedance variation circuit 300. As a result, when the HF power is applied in synchronization with the phase within one cycle of the reference electrical state, the impedance matching becomes satisfactory, and the occurrence of IMD may be further suppressed.

The impedance variation circuit 300 may be inserted into and integrated with the matching unit 88. The impedance variation circuit 300 is preferable because the HF power is hardly affected by the LF power when the power feeding rod is branched and inserted into the second radio-frequency power supply 90. When a filter is provided between the first radio-frequency power supply 48 and the second radio-frequency power supply 90, the HF power is further hardly affected by the LF power, so that the variation of the summed impedance Z may be reduced, and the occurrence of IMD is further suppressed.

(Modification 3)

In Modification 3, as illustrated in FIG. 10A, an electromagnet 350 is provided on the top of the processing container 10. The position of the electromagnet 350 is not limited to the position illustrated in FIG. 10A, and may be a portion of the processing container 10, for example, a portion inside the processing container 10. The controller 200 controls the strength of the electromagnet 350 according to the phase (or impedance) of the reference electrical state, the phase of LF, the electrode potential to which the bias power is applied, LF Vdc, the reflected wave power of HF or the like, so as to control the characteristics of the magnetic field. For example, as illustrated in FIG. 10B, the magnetic field is controlled to be relatively strong at the negative timing of LF Vdc when the sheath becomes thick, and is controlled to be relatively weak or eliminated at the positive timing of LF Vdc when the sheath becomes thin, so as to reduce the variation of the impedance Z. As a result, the occurrence of IMD may be further suppressed. The electromagnet 350 may be a multi-pole electromagnet or a fixed magnet, and is an example of a magnetic field generator that generates a magnetic field. The control by the electromagnet 350 represented in Modification 3 may be combined with the control by the additional circuit 250 of Modification 1 or the impedance variation circuit 300 of Modification 2.

(Modification 4)

When the sheath thickness varies, the apparent capacitance varies, and the resonance frequency of HF varies. The matching unit 88 functions to cause the sum of all of the L and C components of the inductance (e.g., the power feeding rod) and the capacitance (e.g., the sheath) inside the processing container 10 to resonate as the frequency of HF, so as to take a matching.

Accordingly, since the C component varies when the sheath thickness varies, the reflected wave power necessarily increases unless the matching unit 88 takes a matching again in response to the variation of the C component that corresponds to the variation of the sheath thickness. However, since it takes about 1 second to move the variable capacitor, the matching unit 88 may not follow the variation of the sheath thickness, and thus, may not take an accurate matching.

Thus, in Modification 4, the controller 200 changes the frequency of HF by the amount of the variation of the C component that corresponds to the variation of the sheath thickness. That is, the frequency "f" of HF is changed according to the variation of the C component that corresponds to the sheath thickness, based on the expression of f (supply frequency)$\propto 1/\sqrt{LC}$.

For example, assuming that the capacitance of the sheath on the electrode is C, and when the capacitance C varies to four times according to the variation of the sheath thickness, the frequency of HF is changed to a double. As a result, it is possible to implement a state where a matching is substantially taken according to the variation of the sheath thickness.

When the capacitance C varies to ten times according to the variation of the sheath thickness, the frequency of HF is changed to about 3.3 times. As a result, it is possible to implement a state where a matching is substantially taken according to the variation of the sheath thickness. That is, in Modification 4, as illustrated in FIG. 11A, the frequency of HF is changed based on the expression of the resonance frequency described above, so as to take a matching with the variation of the sheath thickness according to the variation of one cycle of the LF voltage. As a result, a state where a matching is substantially taken according to the variation of the sheath thickness is implemented, so that the reflected wave power of HF may be reduced, and the occurrence of IMD may be suppressed. In Modification 4, a frequency variable power supply capable of changing the frequency of HF may be used as the second radio-frequency power supply 90. Further, the control represented in Modification 4 may be combined with at least one of the additional circuit 250 of Modification 1, the impedance variation circuit 300 of Modification 2, and the electromagnet 350 of Modification 3.

In all of the examples of the embodiment and the modifications described above, a shift time or a delay width may be adjusted by a circuit having a gate function or a delay function, based on an original signal or measurement signal of any one of the phase of LF, the electrode potential, the potential of the power feeding system, Vdc, the sheath thickness of the electrode, the light emission of plasma, the reflection intensity of the HF power and others.

Instead of controlling the timing for applying the HF power in synchronization with the phase within one cycle of the LF voltage, a pulse-type power that corresponds to the peak of the LF voltage (hereinafter, also referred to as an "LF pulse") may be applied, and the timing for applying the HF power may be controlled according to the LF pulse, as illustrated in FIG. 11B. That is, for example, the LF pulse that corresponds to LF of 400 kHz may be applied by being turned ON/OFF, and the HF power may be controlled in a pulse form (an HF pulse) according to the LF pulse. The power of the LF pulse that corresponds to the peak of the phase of the reference electrical state may be applied, and the timing for applying the HF power may be controlled according to the LF pulse.

As described above, the strength of occurring IMD varies according to the LF power. Thus, in the control method of the plasma processing apparatus 1 according to each of the embodiment and the modifications described above, the timing when the reflected wave power of HF is relatively low is selected, and the HF power is applied at that timing, so that the occurrence of IMD may be reduced. By reducing the occurrence of IMD, it is possible to improve the stability of the process and the plasma processing apparatus 1, and reduce apparatus costs. Further, the plasma density, the self-bias Vdc and others may be controlled.

However, when the time for applying the HF power is reduced, the absolute amount of the HF power may decrease, and the plasma density Ne may decrease. Thus, the LF power and the HF power may be applied at each of two timings including timings when the reference electrical state peaks twice within one cycle. Further, the control method for applying the HF power may be freely changed. The HF power may not be applied to only the lower electrode, but may be applied to the upper electrode.

[Control Method]

As described above, the control method of the parallel plate type plasma processing apparatus 1 according to the embodiment includes supplying the bias power to the lower electrode that places the wafer W thereon, and applying the source power having a frequency higher than that of the bias power to the lower or upper electrode so as to supply the source power into the plasma processing space. The source power has the first state and the second state, and the control method includes the first control process of alternately applying the first state and the second state in synchronization with the signal synchronized with the cycle of the radio frequency of the bias power, or the phase within one cycle of the reference electrical state that represents any one of a voltage, a current, and an electromagnetic field measured in the power feeding system of the bias power.

The control method may be performed by a plasma processing apparatus other than the parallel plate type plasma processing apparatus. The control method of a plasma processing apparatus other than the parallel plate type plasma processing apparatus includes supplying the bias power to the lower electrode, and supplying the source power having a frequency higher than that of the bias power into the plasma processing space. In this control method as well, the source power has the first state and the second state, and the control method includes the first control process of alternately applying the first state and the second state in synchronization with the phase within one cycle of the reference electrical state.

[Modifications 5-1 to 5-4]

Next, a control method of a plasma processing apparatus 1 according to each of Modifications 5-1 to 5-4 of the embodiment will be described. In Modifications 5-1 to 5-4, a control is performed for intermittently stopping the source power and/or the bias power. FIGS. 13A to 13D are timing charts illustrating the control methods according to Modifications 5-1 to 5-4 of the embodiment.

Figure 13A:
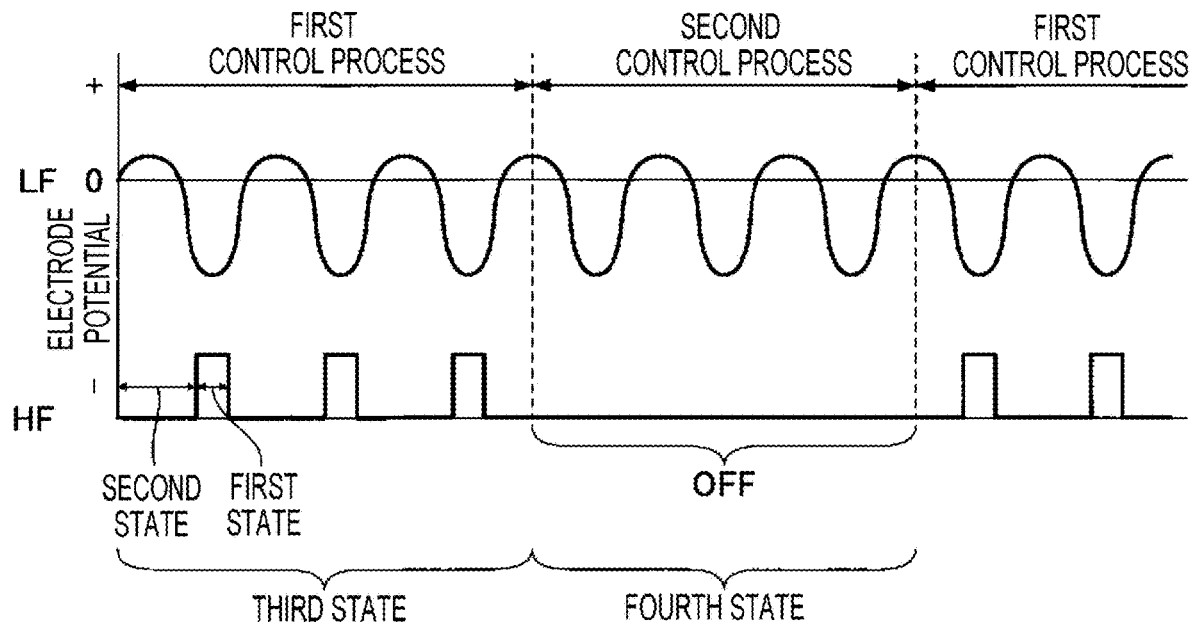
FIG. 13A is a timing chart illustrating a control method according to Modification 5-1 of the embodiment.

Modification 5-1 of FIG. 13A includes a second control process of intermittently stopping the source power in an independent cycle from the cycle of the reference electrical state which is represented by the LF voltage as an example, in addition to the first control process. The first control process and the second control process are repeatedly performed.

In Modification 5-1, the LF voltage is applied in the same cycle in the first control process and the second control process. Meanwhile, the source power alternately repeats the first state and the second state one or more times in the first control process, and is intermittently stopped in the second control process between first control processes.

In the first control process and the second control process, the frequency of LF may be, for example, 0.1 Hz to 100 Hz. The duty ratio of the source power (=fourth state/(third state+fourth state)) may fall in a range of 1% to 90%.

The state of the source power synchronized with the cycle of the reference electrical state in the first control process is an example of a third state. The state of the source power which is independent from the cycle of the reference electrical state in the second control process is an example of a fourth state different from the third state.

Figure 13B:
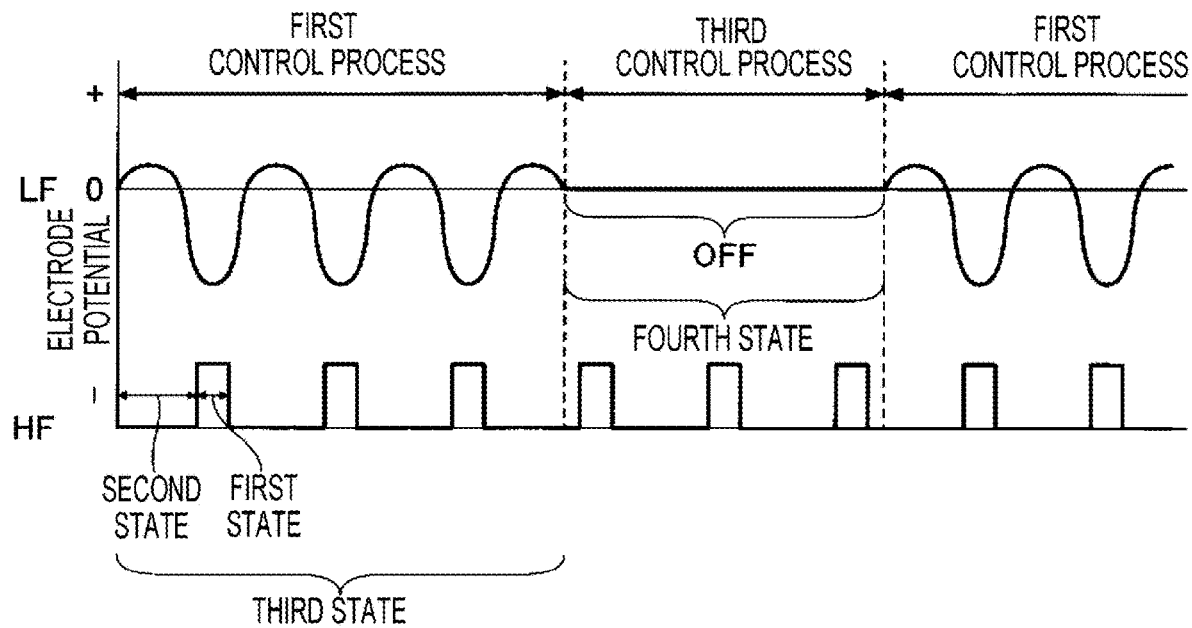
FIG. 13B is a timing chart illustrating a control method according to Modification 5-2 of the embodiment.

The control method according to Modification 5-2 in FIG. 13B includes a third control process of intermittently stopping the bias power in an independent cycle from the cycle of the HF voltage or current, in addition to the first control process which is the same as Modification 5-1. The state of the bias power in the third control process is an example of the fourth state.

In Modification 5-2, the first control process and the third control process are repeatedly performed. In Modification 5-2, the source power of the third control process repeats the first state and the second state in the same cycle as that in the first control process.

In the first control process, the frequency of LF may be, for example, 0.1 Hz to 100 Hz. The duty ratio of the bias power (=fourth state/(third state+fourth state)) may fall in a range of 1% to 90%.

Figure 13C:
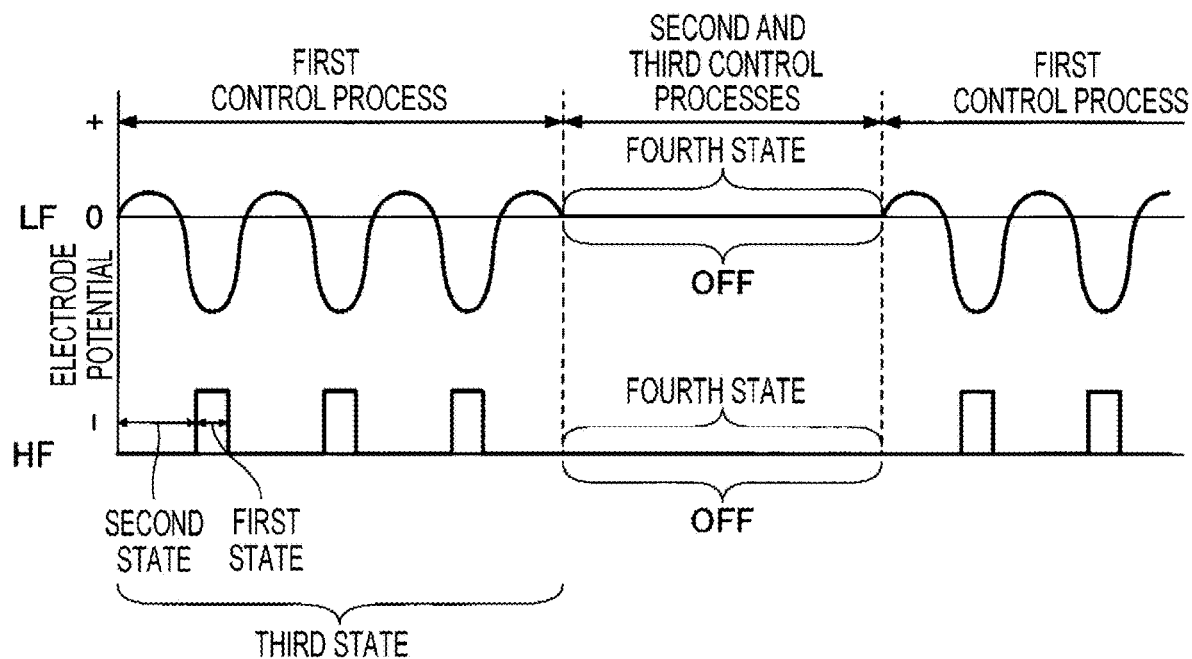
FIG. 13C is a timing chart illustrating a control method according to Modification 5-3 of the embodiment.

In the control method according to Modification 5-3 in FIG. 13C, the control of the source power in the second control process of Modification 5-1 and the control of the bias power in the third control process of Modification 5-2 are performed, in addition to the first control process which is the same as Modification 5-1. That is, in Modification 5-3, the state where both of the source power and the bias power are intermittently stopped is an example of the fourth state.

Figure 13D:
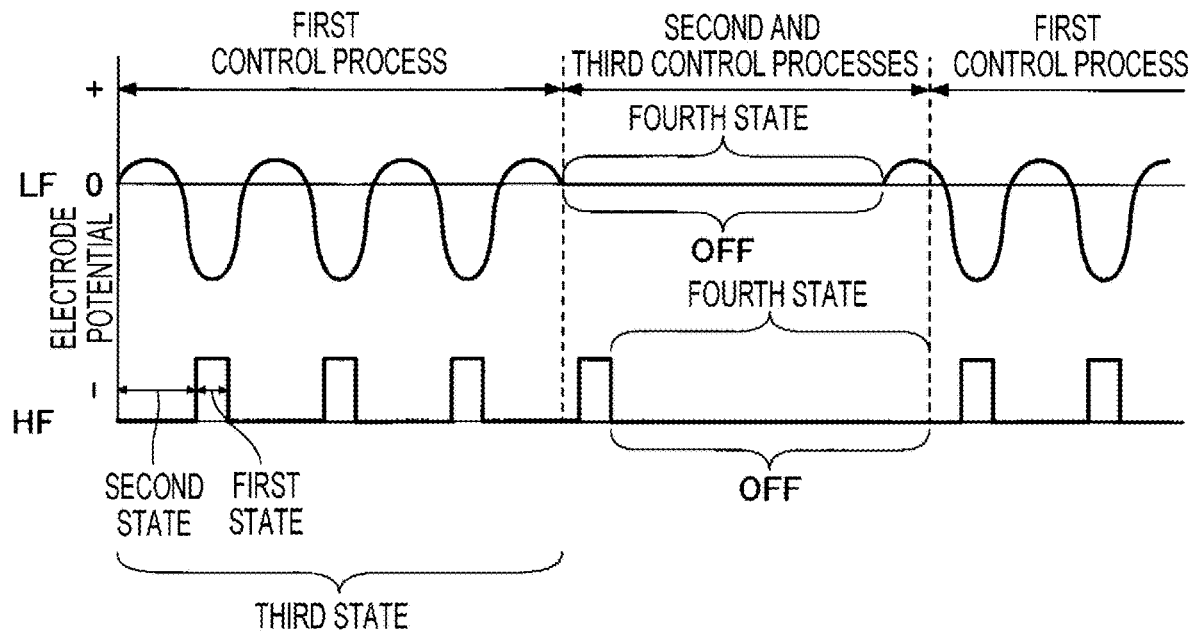
FIG. 13D is a timing chart illustrating a control method according to Modification 5-4 of the embodiment.

The cycle for intermittently stopping the bias power and the cycle for intermittently stopping the source power may be synchronized with each other. In this case, the cycles for intermittently stopping the source power and the bias power may be the same as illustrated in FIG. 13C, or the source power may be shifted behind or in front of the bias power as illustrated in FIG. 13D. The time for stopping the source power may be longer or shorter than the time for stopping the bias power.

[Effects of Control Methods According to Modifications 5-1 to 5-4]

As described above, in the control methods according to Modifications 5-1 to 5-4, the quality and amount of radicals and ions may be controlled. Specifically, when HF is turned OFF, ions in plasma are substantially extinguished, whereas radicals exist without being extinguished for some time because radicals have a long life. Accordingly, radicals may be uniformly diffused while HF is turned OFF. Further, while HF is controlled to be turned OFF or Low, the ratio of ions to radicals in plasma may be changed. As a result, the amount of radicals and ions may be controlled.

As the dissociation of a gas is progressed, radicals are generated with the progress of the dissociation. For example, $C_4F_8$ gas is dissociated into $C_4F_8 \rightarrow C_4F_7^* \rightarrow \ldots \rightarrow CF_2$, and different radicals (e.g., $C_4F_7^*$) are produced according to the degree of dissociation. Examples of the parameters for progressing the dissociation include the ion energy and the reaction time. Accordingly, by controlling the timing or time for applying the bias power or the source power so as to control the ion energy and/or the reaction time and promote the production of radicals suitable for a process, it is possible to control the quality of radicals and ions.

Further, since the ion energy decreases while the bias power is turned OFF, the etching may not be progressed, and by-products deposited on the bottom of a hole or the like may be removed to the outside of the hole and deposited on the mask. Further, radicals may be attached to the pattern surface of the wafer W while the bias power is turned OFF. As a result, the radicals attached to the mask protect the mask, so that the mask selectivity may be improved. As a result, the etching is promoted so that the etching rate may increase, and the etching shape may be improved.

While examples of the effects obtained when the source power is intermittently stopped have been described, the present disclosure is not limited thereto. For example, since plasma may also be generated by the bias power, the same effects as described above may be obtained when the bias power is intermittently stopped. That is, by intermittently stopping the bias power, the quality and amount of radicals and ions may be controlled. As a result, the etching shape may be improved while increasing the etching rate.

In FIGS. 13A to 13D, the source power is turned ON at the timing when LF Vdc is negatively deep, in the third state. However, the present disclosure is not limited thereto, and the source power may be turned ON at the timing when LF Vdc is positive or at another timing. Instead of periodically turning the source power ON/OFF, the source power may be periodically controlled to be High/Low.

[Modification 6]

Figure 14:
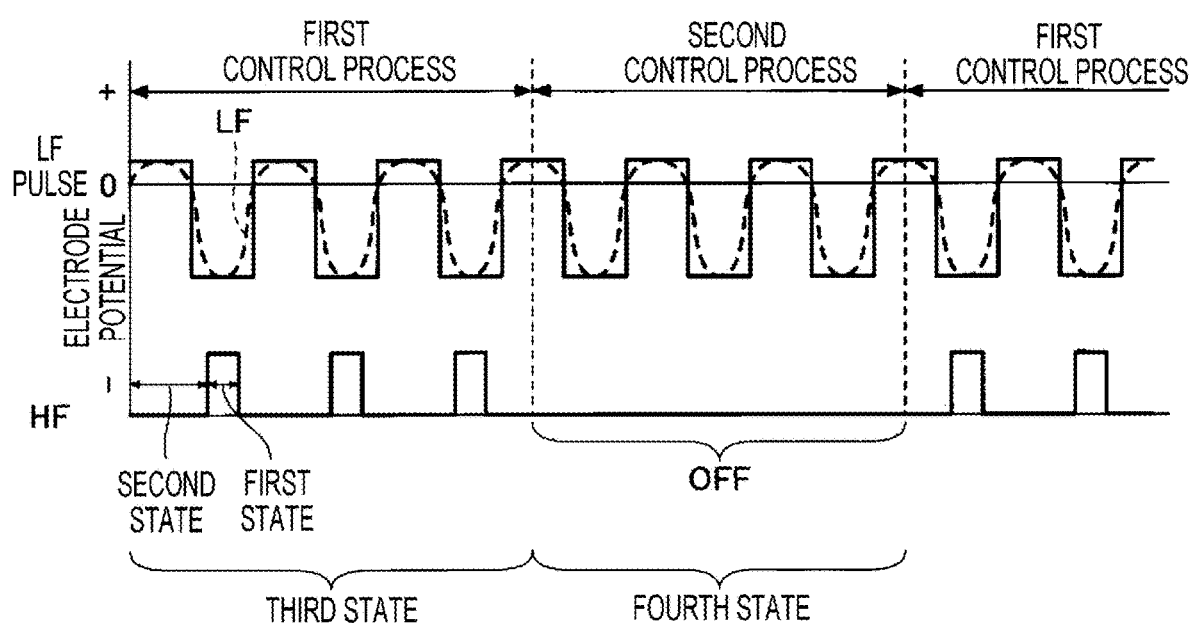
FIG. 14 is a timing chart illustrating a control method according to Modification 6 of the embodiment.

Next, a control method according to Modification 6 of the embodiment will be described with reference to FIG. 14. FIG. 14 is a timing chart illustrating the control method according to Modification 6 of the embodiment.

For example, in the control method according to Modification 6, the LF pulse is applied to the stage 16 as illustrated in FIG. 14. The positive value of the LF pulse coincides with the positive peak of the LF voltage, and the negative value of the LF pulse coincides with the negative peak of the LF voltage.

In this case, in the control method according to Modification 6, the first state and the second state of HF are alternately applied in synchronization with the phase within one cycle of the LF pulse. In this case as well, the amount and quality of radicals and ions may be controlled.

Specifically, in a portion of or entire LF pulse that is positive, the source power may be controlled to be turned OFF or Low, and in a portion of or entire LF pulse that is negative, the source power may be controlled to be turned ON or High. Then, since the LF pulse is binarized, and accordingly, the source power is controlled to be binarized, the control is facilitated. While FIG. 14 controls the state of HF illustrated in FIG. 13A in accordance with the LF pulse obtained by changing the LF voltage illustrated in FIG. 13A into a pulse form, the present disclosure is not limited thereto. For example, the state of HF illustrated in each of FIGS. 13B to 13D may be controlled in accordance with the LF pulse obtained by changing the LF voltage of each of FIGS. 13B to 13D into a pulse form.

[Modifications 7-1 to 7-4]

Figure 15A:
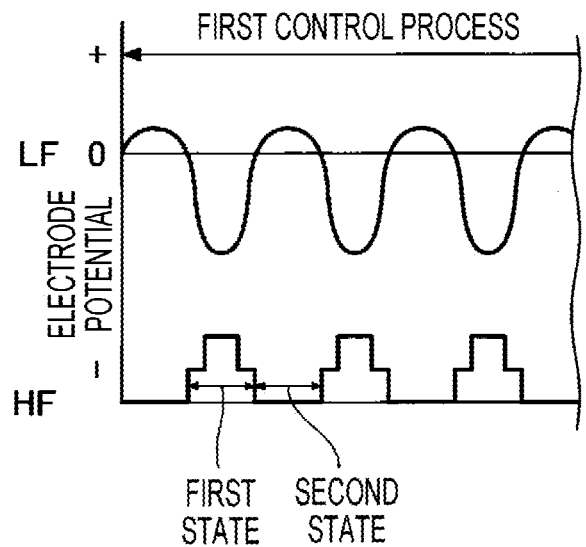
FIG. 15A is a timing chart illustrating a control method according to Modification 7-1 of the embodiment.
Figure 15B:
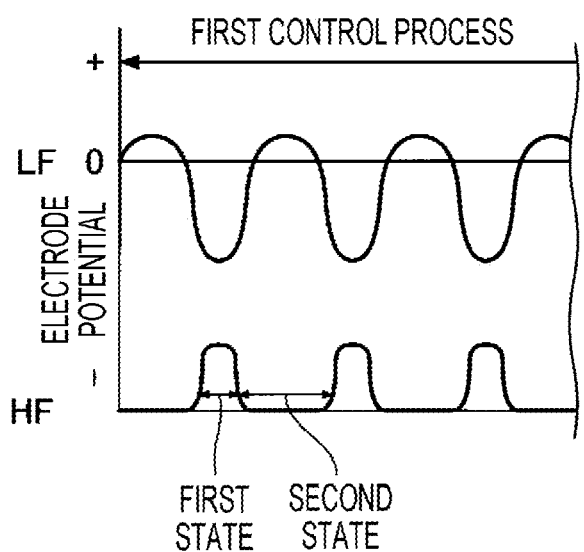
FIG. 15B is a timing chart illustrating a control method according to Modification 7-2 of the embodiment.
Figure 15C:
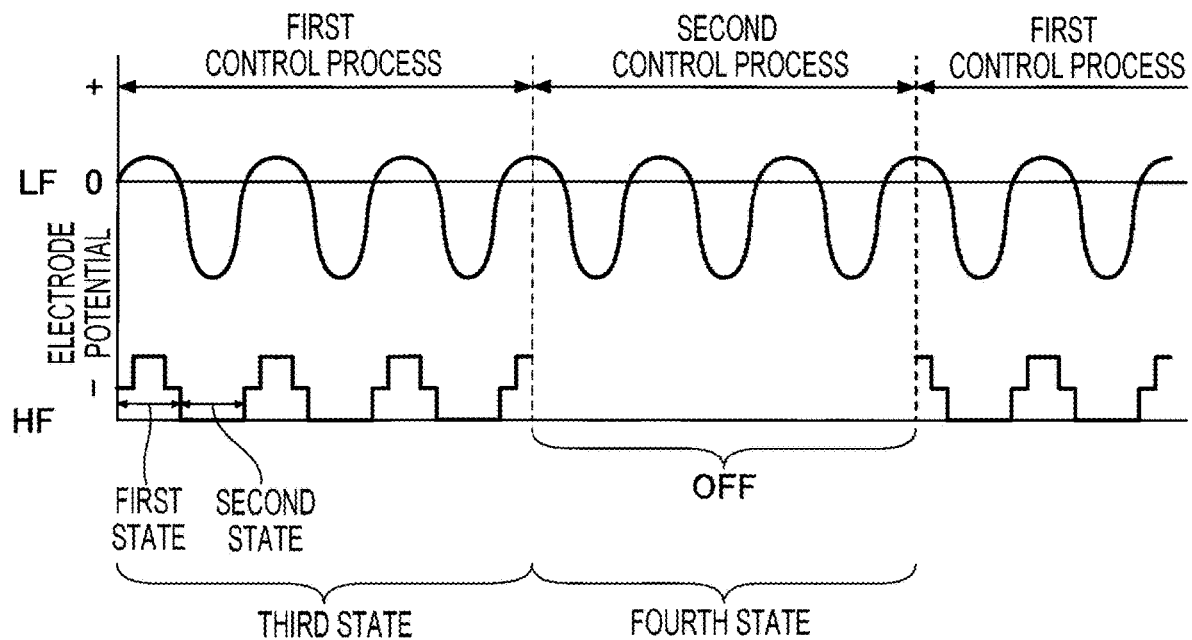
FIG. 15C is a timing chart illustrating a control method according to Modification 7-3 of the embodiment.
Figure 15D:
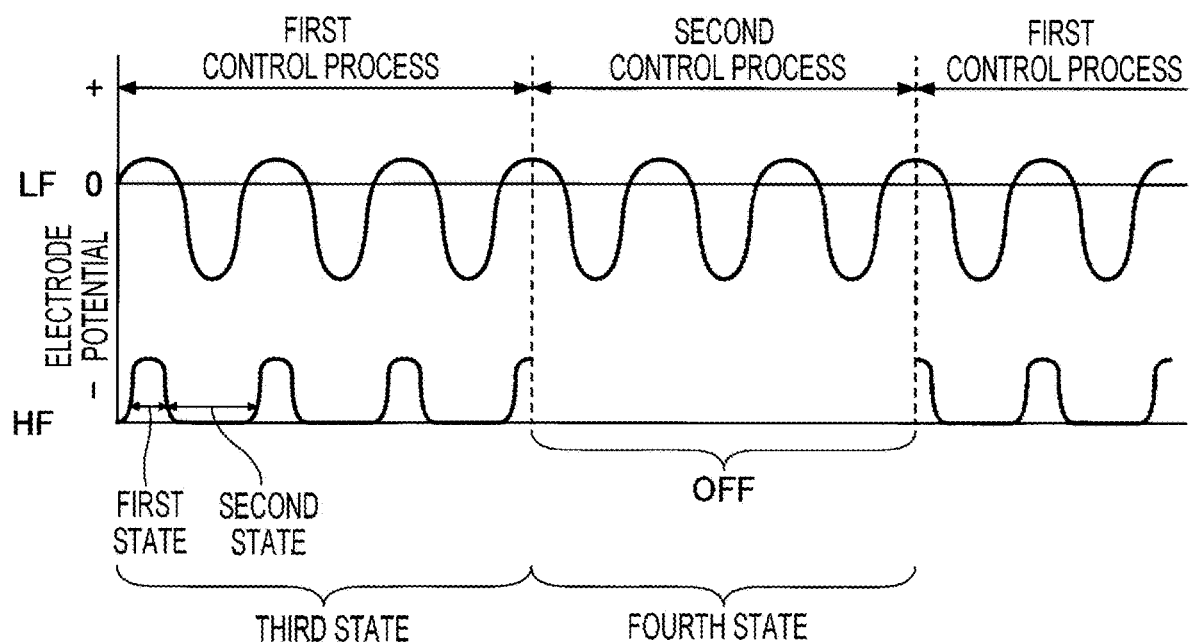
FIG. 15D is a timing chart illustrating a control method according to Modification 7-4 of the embodiment.

Next, control methods according to Modification 7-1 to 7-4 of the embodiment will be described with reference to FIGS. 15A to 15D. FIG. 15A is a timing chart illustrating the control method according to Modification 7-1 of the embodiment. FIG. 15B is a timing chart illustrating the control method according to Modification 7-2 of the embodiment. FIG. 15C is a timing chart illustrating the control method according to Modification 7-3 of the embodiment. FIG. 15D is a timing chart illustrating the control method according to Modification 7-4 of the embodiment.

In the control methods according to Modifications 7-1 and 7-2 illustrated in FIGS. 15A and 15B, the first state and the second state of the source power are alternately applied in synchronization with the phase within one cycle of the reference electrical state which is the LF voltage or the electrode potential as an example, in the first control process. In Modification 7-1, the first state of the source power has two or more states by stages in synchronization with the timing when the electrode potential is negative. In Modification 7-2, the first state of the source power smoothly has two or more states in synchronization with the timing when the electrode potential is negative. The first state of the source power may be synchronized with the timing when the electrode potential is positive.

Each of the control methods according to Modifications 7-3 and 7-4 illustrated in FIGS. 15C and 15D includes the second control process, in addition to the first control process, and in the first control process, the first state and the second state of the source power are alternately applied in synchronization with the phase within one cycle of the reference electrical state which is the LF voltage as example. In Modification 7-3, the first state of the source power has two or more states by stages in synchronization with the timing when the electrode potential is positive. In Modification 7-4, the first state of the source power smoothly has two or more states in synchronization with the timing when the electrode potential is positive. The first state of the source power may be synchronized with the timing when the electrode potential is negative.

In Modifications 7-1 to 7-4, the first state of the source power is controlled using a plurality of values, so that the amount and quality of radicals and ions may be more accurately controlled. Instead of the second control process illustrated in FIGS. 15C and 15D, the third control process illustrated in FIG. 13B may be performed, in addition to the first control process illustrated in FIGS. 15C and 15D.

In the control method according to Modification 3 of the embodiment, the strength of the electromagnet 350 is controlled according to the phase (or impedance) of the reference electrical state, the phase of LF, the electrode potential to which the bias power is applied, LF Vdc, the reflected wave power of HF of the like. As a result, the variation of the impedance viewed from the matching units 46 and 88 may be reduced, so that the occurrence of IMD may be suppressed. In the control method according to Modification 4 of the embodiment, the frequency of HF is changed by the variation amount of the C component according to the variation of the sheath thickness. That is, the frequency "f" of HF is changed according to the variation of the C component that corresponds to the sheath thickness, based on the expression of "f" (supply frequency)$\propto 1/\sqrt{LC}$. As a result, the state where a matching is substantially taken according to the variation of the sheath thickness is implemented, so that the reflected wave power of HF may be reduced, and the occurrence of IMD may be suppressed. In Modification 4, a frequency variable power supply capable of changing the frequency of HF may be used as the second radio-frequency power supply 90.

When the load impedance is constant, the frequency variable power supply performs a control to continuously change the frequency so as to reduce the reflected wave power of the source power as much as possible. However, in a case where the source power is controlled in synchronization with the phase within one cycle of the LF voltage or current, the load of HF largely periodically varies within one cycle of the LF voltage or current. Accordingly, the second radio-frequency power supply 90 needs to change the frequency in accordance with the sheath thickness that largely periodically varies according to the phase within one cycle of LF, and more preferably, the impedance that corresponds to the sheath thickness.

Figure 16A:
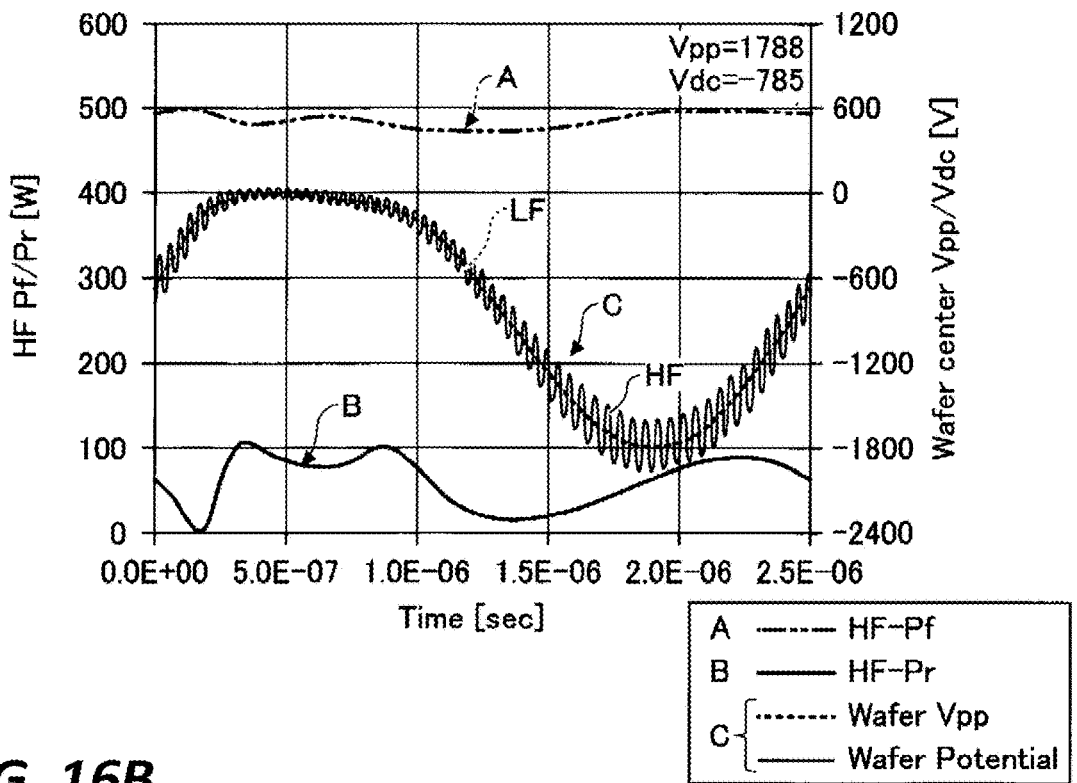
FIGS. 16A and 16B are views illustrating an example of a reflected wave power of a source power according to the embodiment.
Figure 16B:
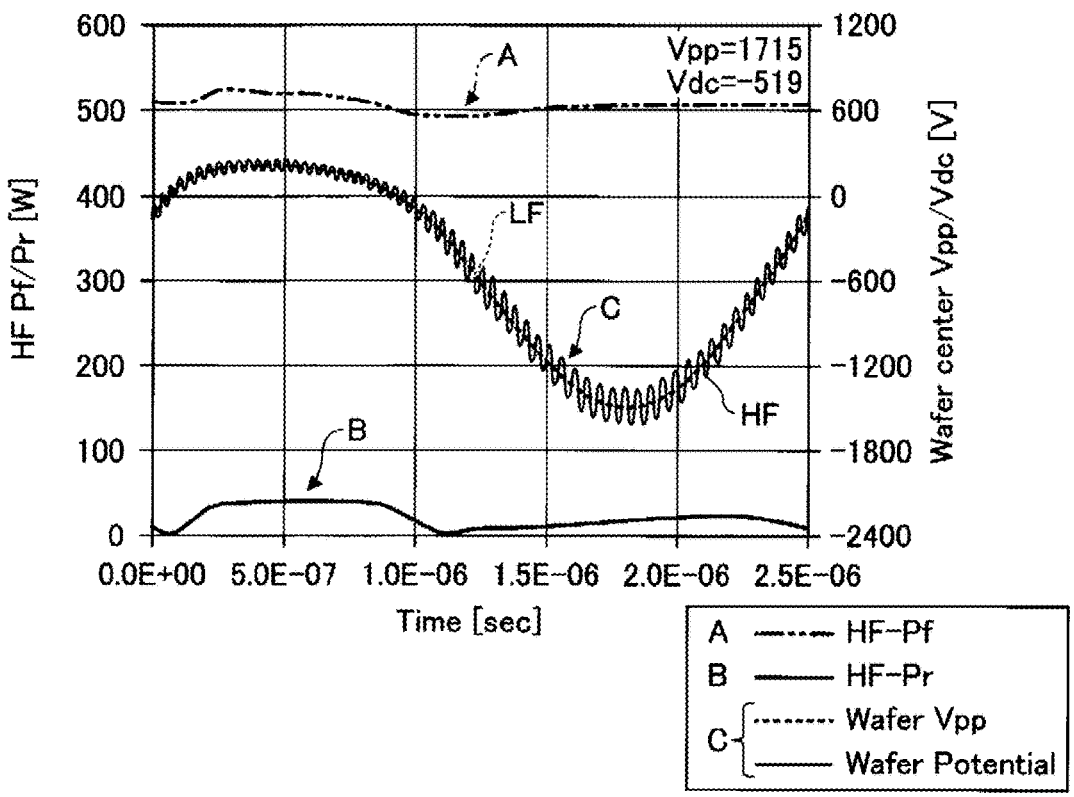

For example, FIGS. 16A and 16B are views illustrating an example of a reflected wave power of HF (HF-Pr) according to the embodiment. The reflected wave power of HF varies according to the type of gas or the phase of LF. For example, FIG. 16A illustrates an example of the reflected wave power of HF (see B) in a case where argon gas is supplied into the processing container 10 to apply the traveling wave power HF-Pf of HF of 500 W (see A), and an LF power of 1,000 W is applied. FIG. 16B illustrates an example of the reflected wave power of HF (see B) in a case where $SF_6$ gas is supplied into the processing container 10 to apply the traveling wave power of HF of 500 W (see A), and an LF power of 1,000 W is applied. Here, the "C" represents the potential of the wafer placed on the stage 16. The potential of the wafer is substantially equal to Vpp of the LF voltage when the frequency of LF is, for example, 400 kHz, and the width (amplitude) of Vpp of the HF voltage when the HF frequency is, for example, 100 MHz is added, such that the potential of the wafer vibrates with both of the potentials.

From B in each of FIGS. 16A and 16B, it may be understood that the output form of the reflected wave power of HF with respect to the phase within one cycle of LF differs in the case where argon gas is supplied and in the case where $SF_6$ gas is supplied.

It is not practical to change the frequency of HF output from the second radio-frequency power supply 90 into an optimum frequency in real time, according to the difference in output form of the reflected wave power of HF, because it takes time for the second radio-frequency power supply 90 to determine the optimum frequency. For example, a normal frequency variable power supply is able to perform a work of measuring the reflected wave power by shifting the frequency, at 1 kHz to 10 kHz to the maximum. Meanwhile, for example, as for LF of 400 kHz, when one cycle is divided into 10 sections, each section has 4 MHz. In order to shift the wavelength 10 times within each section, the wavelength needs to be changed to 40 MHz, and the reflection amount of HF and the variation direction of the frequency of HF need to be determined in synchronization with the wavelength in real time. This work is not practical since the determination may not be performed in time with the operation frequency of the normal frequency variable power supply.

In control methods according to Modifications 8 to 11 of the embodiment, when the reflected wave power of HF is controlled in synchronization with the phase within one cycle of the reference electrical state (the phase of LF in the present modification), a frequency with the small reflection of HF in each phase obtained by dividing one cycle of LF is obtained, so that the reflected wave power of HF is minimized. In Modifications 8 to 11, each phase of LF indicates each phase obtained by dividing one cycle of LF into at least 10 sections. However, the number of divisions of one cycle of LF is not limited thereto, and may be any of 10 to 100. As the number of divisions of the phase of one cycle of LF increases, the control accuracy is improved, so that the reflected wave power of HF may be further reduced. The processor 100 executes the control in Modifications 8 to 11.

[Modification 8]

Figure 17:
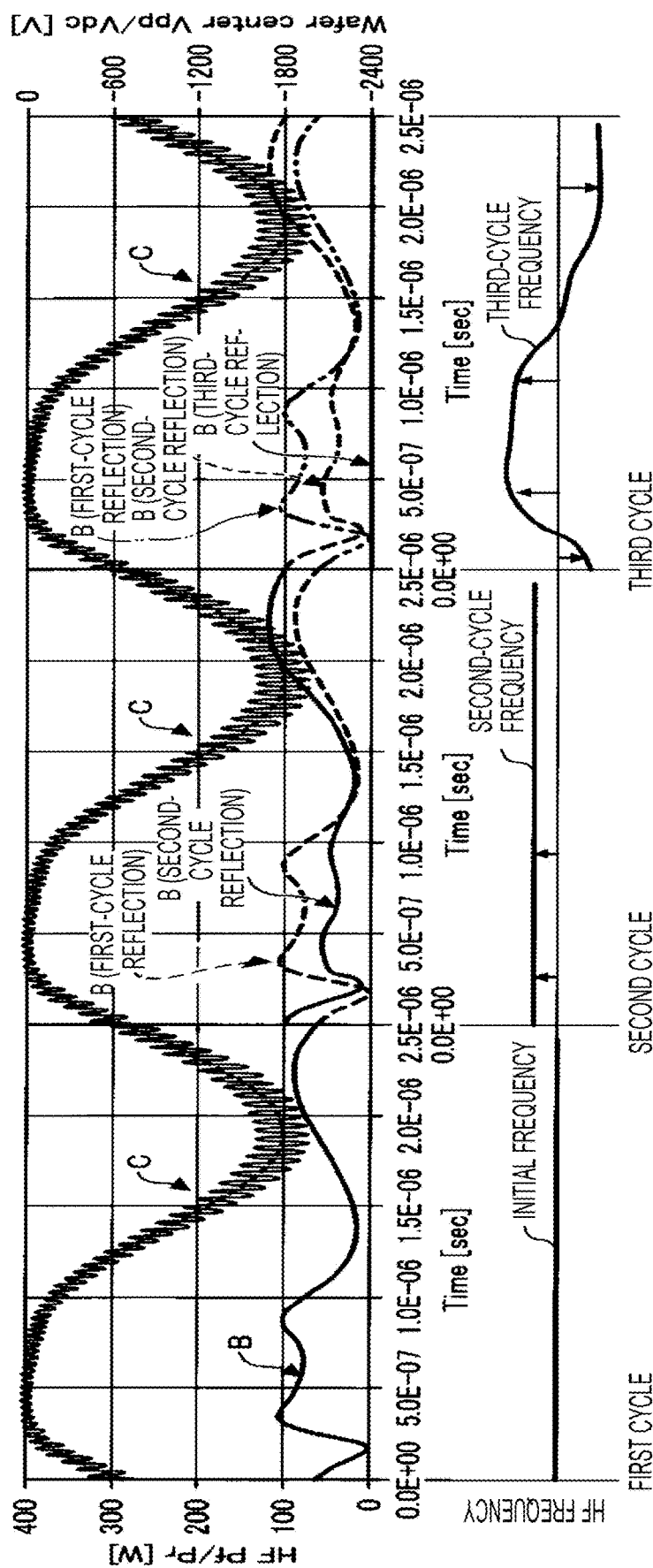
FIG. 17 is a timing chart illustrating a control method according to Modification 8 of the embodiment.

First, the control method according to Modification 8 of the embodiment will be described with reference to FIG. 17. FIG. 17 is a timing chart illustrating the control method according to Modification 8 of the embodiment. In the control method according to Modification 8 of the embodiment, the frequency of HF is changed in synchronization with each phase obtained by dividing one cycle of LF into a plurality of sections. The reflected wave power of HF at that time is monitored, and from the monitoring result, the HF frequency of the second radio-frequency power supply 90 is controlled such that the reflected wave power of HF is reduced in each phase. Then, a sequence of detecting a new frequency of HF output from the second radio-frequency power supply 90 is performed at a predetermined time interval, for example, before or during the process, and the HF frequency controlled by the second radio-frequency power supply 90 is determined based on the result.

In FIG. 17, the horizontal axis represents time, the left vertical axis represents the HF traveling wave power HF-Pf and the HF reflected wave power HF-Pr, and the right vertical axis represents the wafer potential.

The first cycle of FIG. 17 represents the reflected wave power of HF (see B) when the frequency controlled by the second radio-frequency power supply 90 is set to the initial frequency within the first one cycle of LF (the first cycle of C). The initial frequency is an arbitrary value, and is set to, for example, one basic frequency (e.g., 40 MHz).

In the second cycle of FIG. 17, the frequency controlled by the second radio-frequency power supply 90 is changed from the initial frequency to another frequency within the second one cycle of LF (the second cycle of C). However, in the second cycle, the frequency is not increased or decreased for each phase obtained from dividing the phase of one cycle of LF, but is set to be either increased or decreased to obtain a result of a dependence of the reflection amount on the phase. While the second cycle of FIG. 17 represents the example where the frequency (the second-cycle frequency) is increased, the frequency may be decreased.

As a result, it may be found that the second-cycle reflected wave power of HF indicated by the solid line B in FIG. 17 has a portion where the reflection decreases and a portion where the reflection increases, according to the phase, as compared to the first-cycle reflected wave power of HF indicated by the dashed line B. In FIG. 17, there are a time period during which the reflected wave power of HF decreases when LF has a positive phase, and a time period during which the reflected wave power of HF increases when LF has a negative phase. However, the reflected wave power at this time is merely an example, and is not limited thereto.

In the third cycle of FIG. 17, the shift direction and the shift amount of the frequency controlled by the second radio-frequency power supply 90 are determined within the third one cycle of LF based on the increase/decrease of the reflected wave power of HF in each previous phase. The third-cycle frequency illustrated in FIG. 17 is an example of the determined shift direction and shift amount. The reflected wave power at this time is merely an example, and is not limited thereto.

The shift amount and the first shift direction (the arrow direction of the third-cycle frequency) controlled by the second radio-frequency power supply 90 at one time may be determined based on past data. The shift amount and the first shift direction of the frequency controlled based on past data may be set in advance in a recipe, and a control may be performed based on the recipe. The past data may be the reflected wave power of HF in the previous cycle, the reflected wave power of HF in a cycle before the last cycle, or the reflected wave power of HF in the previous cycle and before the previous cycle. For example, based on the state of the reflected wave power in the previous cycle, the shift direction and the shift amount of the frequency for each phase obtained by dividing the next one cycle of LF may be determined, such that the reflected wave power of HF in the phase is reduced. The shift direction and the shift amount may be determined based on the state of the reflected wave power in past cycle before the previous cycle, in addition to or instead of the state of the reflected wave power in the previous cycle.

The frequency controlled by the second radio-frequency power supply 90 in the third cycle is shifted in a direction in which the reflection decreases. As for the control timing at that time, for example, when one cycle of LF is divided into 10 sections, the frequency is changed at time intervals that correspond to the 10 divisions of one cycle of LF.

In and after a fourth cycle, the second radio-frequency power supply 90 oscillates HF at an appropriate frequency, based on the data obtained in the third cycle or before the third cycle. The frequency controlled by the second radio-frequency power supply 90 is repeated within an allowable frequency range until a predetermined number of times is reached, or until the reflected wave power of HF reaches a predetermined amount, so that the frequency with the small reflected wave power of HF in each phase of one cycle of LF may be obtained.

In the control method according to Modification 8 of the embodiment, the sequence described above is performed at a designated timing. As a result, it is possible to minimize the reflected wave power of HF that varies according to the phase of LF or the type of gas. An example of the designated timing may be a synchronization pulse cycle of time intervals that correspond to an "n" number of divisions of one cycle of LF (n≥10), a time designated in a recipe, a predetermined time interval or the like.

[Modification 9]

Figure 18:
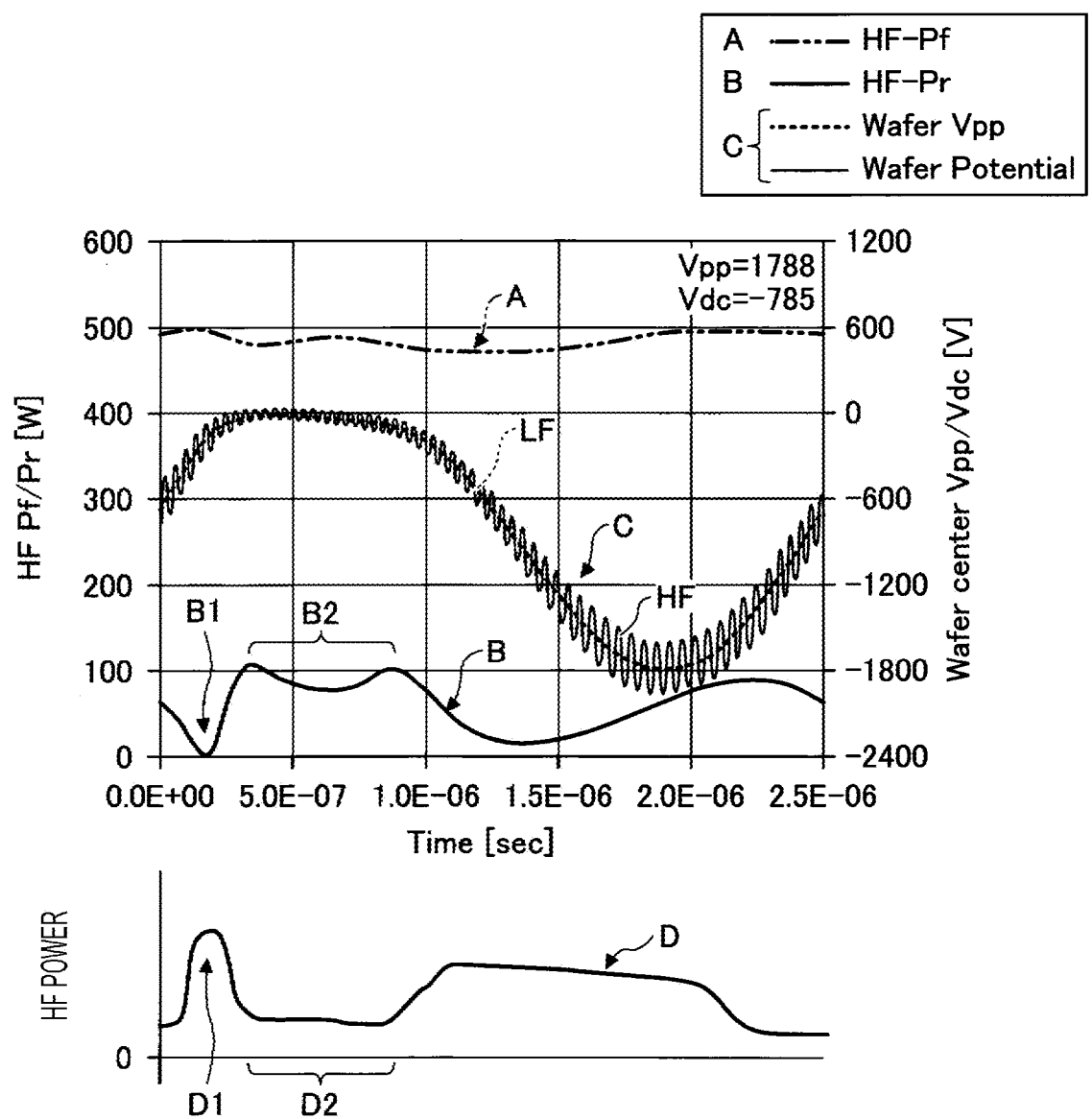
FIG. 18 is a timing chart illustrating a control method according to Modification 9 of the embodiment.

Next, the control method according to Modification 9 of the embodiment will be described with reference to FIG. 18. FIG. 18 is a timing chart illustrating the control method according to Modification 9 of the embodiment. In the control method according to Modification 9 of the embodiment, the second radio-frequency power supply 90 controls the frequency of HF in synchronization with each phase within one cycle of LF as in Modification 8, and furthermore, controls the value of the source power output by the second radio-frequency power supply 90.

For example, as illustrated in FIG. 18, the second radio-frequency power supply 90 controls the frequency of HF in the time period around B1 when the reflected wave power of HF represented by B is small (see FIG. 17), and increases the output of the HF power (the source power) represented by D as indicated by D1. Meanwhile, in the time period B2 when the reflected wave power of HF is large, the second radio-frequency power supply 90 changes the frequency of HF, and decreases the output of the source power as indicated by D2.

In the control method according to Modification 9 of the embodiment, the reflected wave power of HF that varies according to the phase of LF or the type of gas may be reduced as much as possible, and when the reflected wave power of HF is small, the source power is increased so that the decrease in plasma density may be suppressed. Further, when LF has a positive phase, the source power may be controlled in a range of a first source power to a second source power, and when LF has a negative phase, the source power may be controlled in a range of a third source power to a fourth source power. The range of the first source power to the second source power and the range of the third source power to the fourth source power may be different from each other, one of the ranges may include the other, or the ranges may partially overlap with each other.

[Modification 10]

Figure 19:
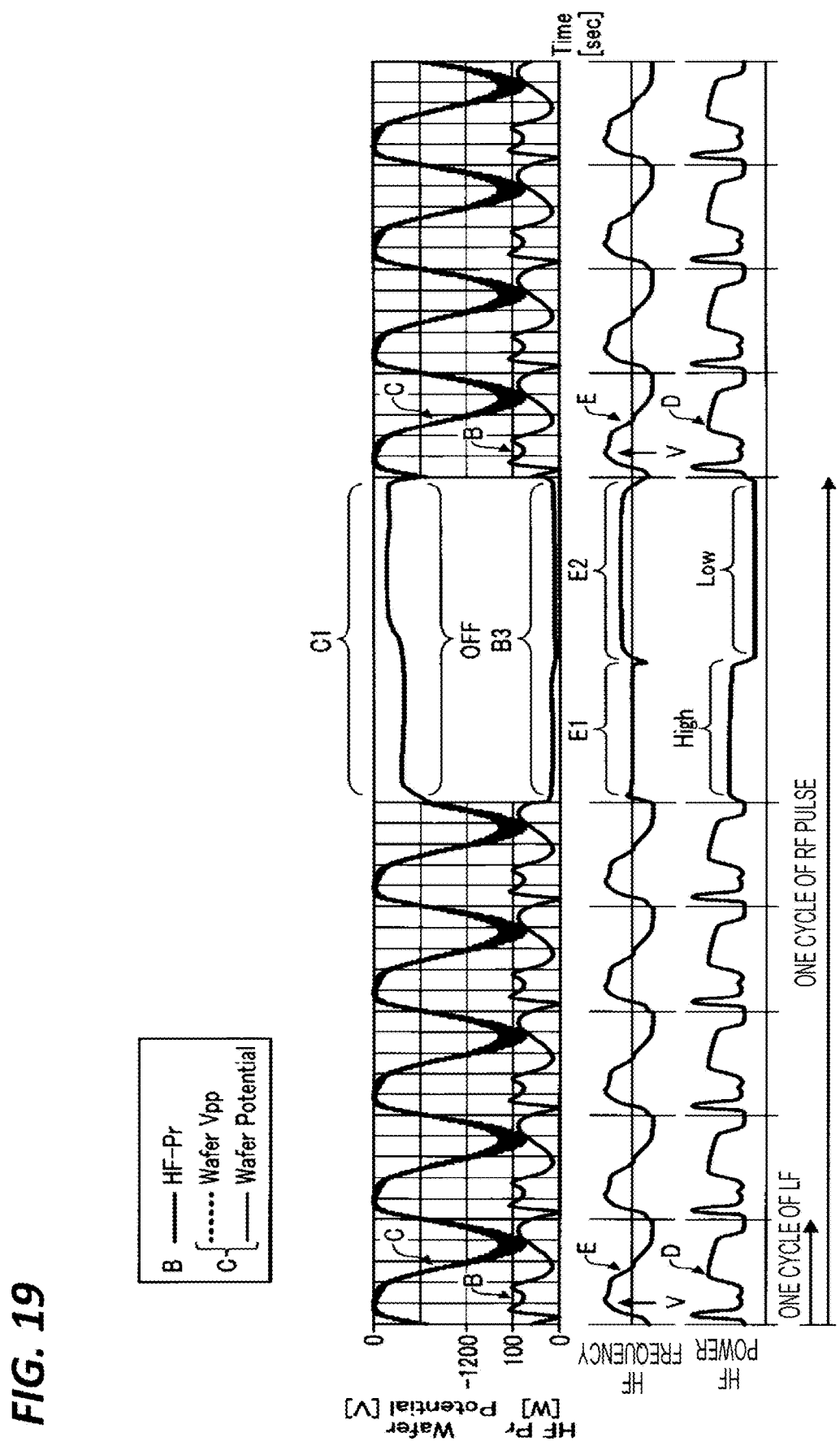
FIG. 19 is a timing chart illustrating a control method according to Modification 10 of the embodiment.

Next, the control method according to Modification 10 of the embodiment will be described with reference to FIG. 19. FIG. 19 is a timing chart illustrating the control method according to Modification 10 of the embodiment.

In FIG. 19, the horizontal axis represents an example of one cycle of LF and one cycle of an RF pulse. One cycle of the RF pulse may be 0.1 kHz to 100 kHz or may be longer or shorter than 0.1 kHz to 100 kHz, but is set to a time period longer than one cycle of LF. In the control method according to Modification 10 of the embodiment, the second radio-frequency power supply 90 may control the frequency of HF according to, for example, each phase obtained by dividing the phase of one cycle of the RF pulse into a plurality of sections. The frequency of HF and the source power may be controlled according to each phase obtained by dividing the phase of one cycle of the RF pulse into a plurality of sections.

In particular, immediately after the RF pulse is turned ON or OFF, the variation of the plasma density Ne and the variation of the electrode potential are large, and thus, the reflected wave power of HF tends to vary differently from the reflected wave power when the RF pulse is normal. Thus, as illustrated in FIG. 19, it takes time for LF to rise, and the sheath is thin (i.e., the capacitance of the sheath is large), immediately after the timing V when the RF pulse is turned ON in each cycle. Accordingly, the second radio-frequency power supply 90 controls the frequency of HF to be high immediately after the timing V when the RF pulse is turned ON (see E).

In FIG. 19, the bias power is turned OFF during the latter half time period of the RF pulse (see C1). During the time period, the reflected wave power of HF is constant near 0 as represented by B3. That is, at the timing when the bias power is turned OFF and the source power is turned ON, the impedance of the sheath is always constant because the bias power is turned OFF. Thus, the reflected wave power of HF becomes constant. Accordingly, while the bias power is turned OFF, the frequency is determined such that the reflected wave power of HF is minimized, and the second radio-frequency power supply 90 outputs the source power of the determined frequency.

The source power may be controlled to be turned OFF or turned ON while the bias power is turned OFF. For example, as represented by C1 of FIG. 19, while the bias power is turned OFF, the frequency of HF may be set to the frequency of E1, and the source power may be controlled to be High (or turned ON) in the former half, and the frequency of HF may be changed to the frequency of E2, and the source power may be controlled to be Low (or turned OFF) in the latter half. The cycles for intermittently stopping the source power and the bias power may be the same, or the source power may be shifted behind or in front of the bias power. The time for stopping the source power may be longer or shorter than the time for stopping the bias power.

The control methods according to Modifications 8 to 10 are performed by the processor 100 of FIG. 2A, and a control signal for controlling the HF frequency and the HF power is sent to the second radio-frequency power supply 90 via the signal generation circuit 102. The second radio-frequency power supply 90 changes the frequency or power of HF to be output according to the control signal.

[Modification 11]

Figure 20:
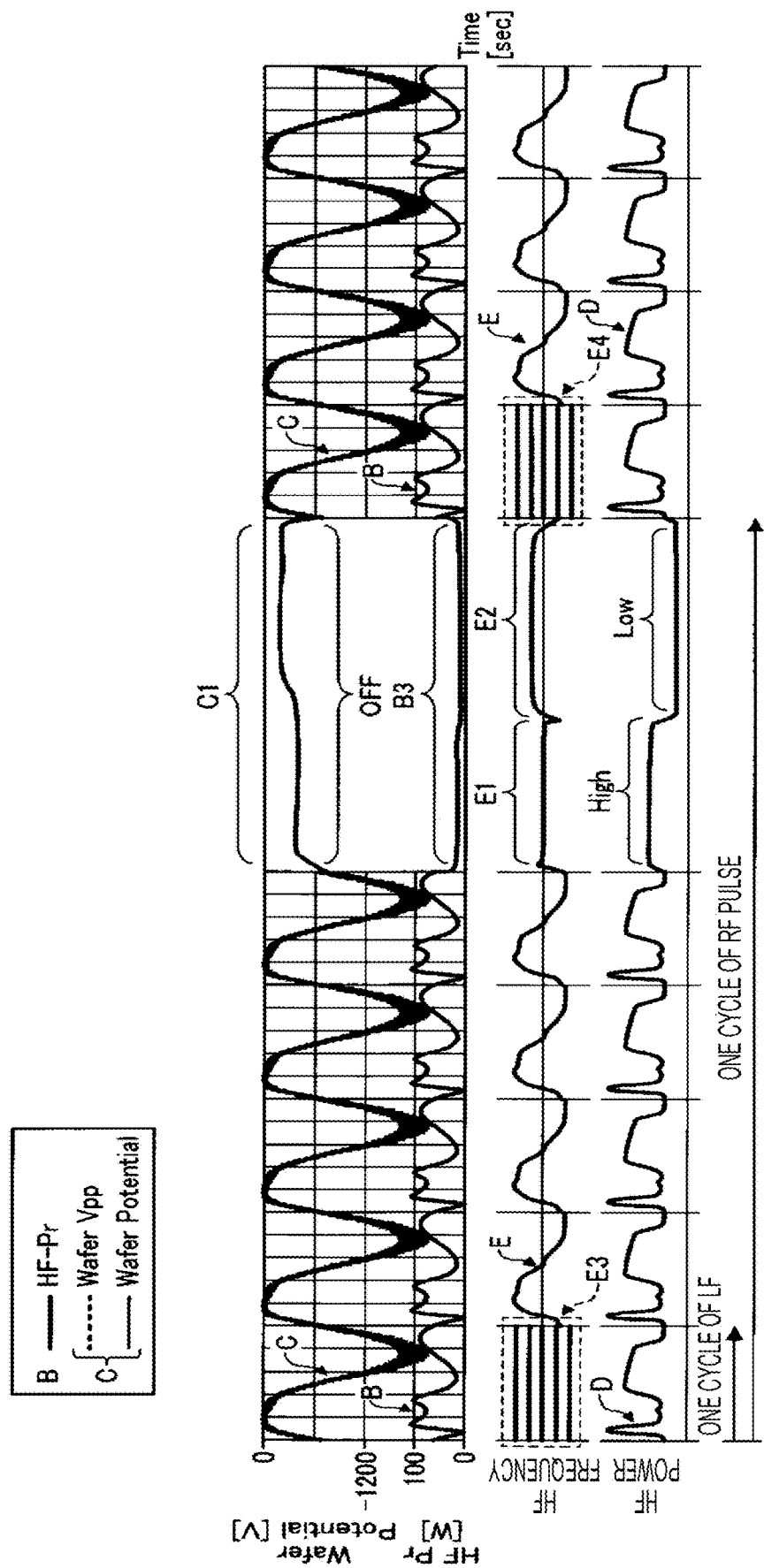
FIG. 20 is a timing chart illustrating a control method according to Modification 11 of the embodiment.

Next, the control method according to Modification 11 of the embodiment will be described with reference to FIG. 20. FIG. 20 is a timing chart illustrating the control method according to Modification 11 of the embodiment.

As described in Modification 10, it takes time for LF to rise, and the sheath is thin (i.e., the sheath has a large capacitance), immediately after the RF pulse is turned ON. Thus, during the rise of the RF pulse, the plasma density Ne largely varies, and the variation of the impedance is relatively significant.

Thus, in the control method according to Modification 11, the second radio-frequency power supply 90 oscillates a composite wave of a plurality of frequencies at the rising timing of the RF pulse in one cycle of LF, that is, at E3 of FIG. 20. The reflection detector 111 of FIG. 2A detects the reflected wave power of HF for each of the plurality of frequencies. The detected reflected wave power of HF for each frequency is sent to the processor 100.

For example, it is assumed that the second radio-frequency power supply 90 may amplify the frequency from 35 MHz to 45 MHz, and oscillates a composite wave of five frequencies of 41 MHz, 42 MHz, 43 MHz, 44 MHz, and 45 MHz. The reflection detector 111 detects the reflected wave power for the source power of each of the five frequencies, and sends the detected reflected wave power to the processor 100. The processor 100 selects the frequency with the smallest reflected wave power from the sent reflected wave powers.

For example, when the frequency with the smallest reflected wave power is 41 MHz, the frequency of 41 MHz may be determined to be the frequency of HF output from the second radio-frequency power supply 90, at the rising timing of the RF pulse in the next one cycle of LF. In E4 of FIG. 20, the source power of each of the five frequencies 39 MHz, 40 MHz, 41 MHz, 42 MHz, and 43 MHz may be output centering on the frequency of 41 MHz with the smallest reflected wave power in the previous cycle.

As a result, the frequency of HF output from the second radio-frequency power supply 90 may reach the target frequency with the smallest reflected wave power of HF at the highest speed. As a result, the source power output from the second radio-frequency power supply 90 may be more quickly brought to the frequency with the small reflected wave power of HF, so that plasma may be more quickly ignited.

When the processor 100 performs the control method according to Modification 11, a control signal is sent to the second radio-frequency power supply 90 via the signal generation circuit 102, for controlling the frequency of HF based on the reflected wave power of HF that corresponds to each of the plurality of frequencies detected by the reflection detector 111 of FIG. 2A.

However, the present disclosure is not limited thereto, and the second radio-frequency power supply 90 may have the function of the processor 100. In this case, the reflected wave power of HF that corresponds to each of the plurality of frequencies detected by the reflection detector 111 is sent from the reflection detector 111 directly to the second radio-frequency power supply 90.

In this case, the second radio-frequency power supply 90 may be implemented as a variable frequency power supply provided with a controller that has the function of the processor 100. That is, in this case, the controller included in the variable frequency power supply acquires the reflected wave power of HF that corresponds to each of the plurality of frequencies of HF from the reflection detector 111, and selects the frequency with the smallest reflected wave power based on the acquired reflected wave powers of HF. Then, the controller determines to cause the source power of the selected frequency to be output from the variable frequency power supply. The variable frequency power supply changes the frequency of the source power to the determined frequency, and outputs the frequency with a predetermined power. As a result, the second radio-frequency power supply 90 may control the frequency of HF and the source power to be output, without using the processor 100 and the signal generation circuit 102. As a result, the second radio-frequency power supply 90 may perform the control methods of Modifications 8 to 11 without using the processor 100.

In the control method of Modification 11, a radio frequency in which a plurality of frequencies are combined with each other is used. However, the radio frequency in which a plurality of frequencies are combined with each other may be used in the control methods of Modifications 8 to 10. Further, a sequence may be provided for freely changing or optimizing the mixing ratio of the radio frequencies of the plurality of frequencies in the control methods of Modifications 8 to 10.

The control methods of Modifications 8 to 11 described above relate to a control method of a plasma processing apparatus having a first electrode that places a workpiece thereon, and includes supplying a bias power to the first electrode, and supplying a source power having a frequency higher than that of the bias power into a plasma processing space. The source power has a first state and a second state. The control method includes a first control process of alternately applying the first state and the second state in synchronization with a signal synchronized with a cycle of a radio frequency of the bias power, or a phase within one cycle of a reference electrical state that represents any one of a voltage, current, and electromagnetic field measured in a power feeding system of the bias power.

[Modification 12]

Figure 21:
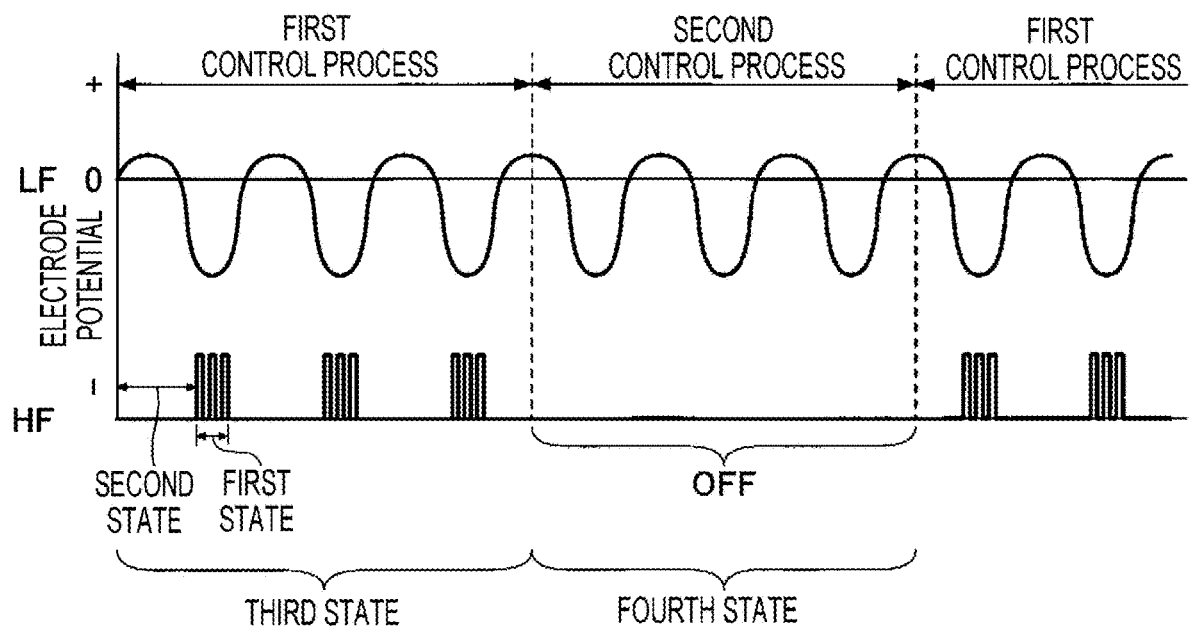
FIG. 21 is a timing chart illustrating a control method according to Modification 12 of the embodiment.

In Modification 12, the first state of the HF voltage takes a pulse-type voltage value in which two or more voltage values are repeated. In the example of FIG. 21, the first state of the HF voltage repeats a positive voltage value and a voltage value 0. However, the present disclosure is not limited thereto, and two or more voltage values, for example, three voltage values may be repeated.

[Modification 13]

The bias power may be a power of a sine waveform, a pulse waveform or a tailored waveform. That is, the bias voltage or current may be a sine waveform, an LF pulse waveform, or a tailored waveform illustrated in FIG. 22. In the tailored waveform, the bias power may be modulated when the HF illustrated in FIG. 22 is in the second state, or may be modulated when the HF is in the first state.

Figure 22:
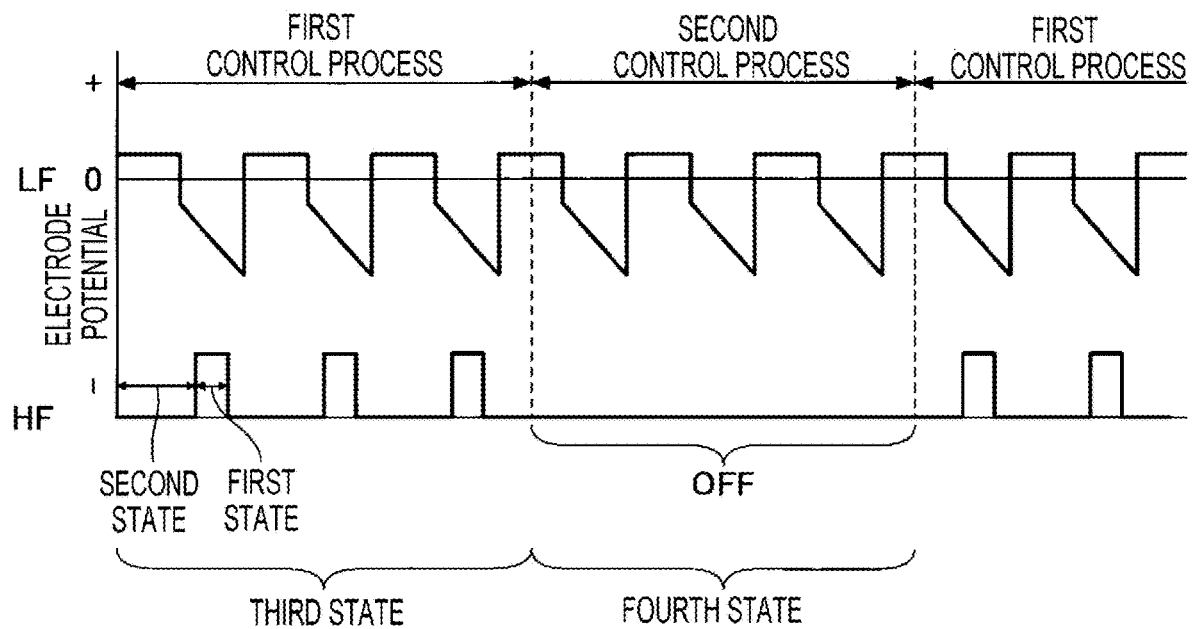
FIG. 22 is a timing chart illustrating a control method according to Modification 13 of the embodiment.

Similarly, when the first state of HF takes two or more voltage values, the waveform of HF may be the tailored waveform illustrated in FIG. 22, in addition to the waveforms illustrated in FIGS. 15A to 15D and FIG. 21.

The plasma processing apparatus and the control method according to the foregoing embodiments are examples in all aspects, and should not be construed as being limited to the examples. The embodiments described above may be modified and improved in various ways without departing from the scope and spirit of the accompanying claims. The descriptions in the plurality of embodiments described above may have other configurations within the scope that does not cause any inconsistency. Further, the descriptions in the plurality of embodiments described above may be combined with each other within the scope that does not cause any inconsistency.

The plasma processing apparatus according to the present disclosure may be applied to any of a capacitively coupled plasma (CCP) type, an inductively coupled plasma (ICP)

type, a radial line slot antenna (RLSA) type, an electron cyclotron resonance plasma (ECR) type, and a helicon wave plasma (HWP) type.

For example, an aspect of the present disclosure provides a control method of a plasma processing apparatus including a first electrode that places a workpiece thereon, and a second electrode that faces the first electrode. The control method includes supplying a bias power to the first electrode, and supplying a source power having a frequency higher than that of the bias power into the plasma processing space. The source power has a first state and a second state. The control method includes a first control process of alternately applying the first state and the second state in synchronization with a phase within one cycle of a reference electrical state.

Another aspect of the present disclosure provides a control method of a plasma processing apparatus including a first electrode that places a workpiece thereon. The control method includes supplying a bias power to the first electrode, and supplying a source power having a frequency higher than that of the bias power into the plasma processing space. The source power has a first state and a second state. The control method includes a first control process of alternately applying the first state and the second state in synchronization with a phase within one cycle of a reference electrical state.

The supplying the source power having a frequency higher than that of the bias power into the plasma processing space may be performed in the manner that a plasma generation source for generating plasma supplies a source power of a microwave source, a radio-frequency power supply or the like into the plasma processing space.

In the descriptions herein, the wafer W is described as an example of the workpiece. However, the substrate is not limited thereto, and may be may be any of various substrates used for a liquid crystal display (LCD) and a flat panel display (FPD), a CD substrate, a print substrate and others.

According to an aspect of the present disclosure, the amount and quality of radicals and ions may be controlled.

(1) A control method of a plasma processing apparatus including a first electrode that places a workpiece thereon, the control method includes: supplying a bias power to the first electrode; and supplying a source power having a frequency higher than that of the bias power into a plasma processing space. The source power has a first state and a second state, and the control method further comprises a first control process of alternately applying the first state and the second state of the source power in synchronization with a signal synchronized with a cycle of a radio frequency of the bias power, or a phase within one cycle of a reference electrical state that represents any one of a voltage, current, and electromagnetic field measured in a power feeding system of the bias power.

(2) In the control method according to (1), the plasma processing apparatus includes a second electrode that faces the first electrode, and the supplying the source power into the plasma processing space applies the source power to the first electrode or the second electrode.

(3) In the control method according to (1), a time period of the first state includes a timing when the phase of the reference electrical state becomes a positive peak.

(4) In the control method according to (1), a time period of the first state includes a timing when the phase of the reference electrical state becomes a negative peak.

(5) In the control method according to (1), the first state is larger than the second state.

(6) The control method according to (1) further includes a second control process of intermittently stopping the source power in an independent cycle from the cycle of the reference electrical state.

(7) The control method according to (1) further includes a third control process of intermittently stopping the bias power in an independent cycle from a cycle of a voltage or current of HF.

(8) The control method according to (1) further includes: a second control process of intermittently stopping the source power in an independent cycle from the cycle of the reference electrical state, and a third control process of intermittently stopping the bias power in an independent cycle from a cycle of a voltage or current of HF. The second control process and the third control process are synchronized with each other.

(9) In the control method according to (1), a pulsed power corresponding to a peak of a phase of the reference electrical state is applied.

(10) In the control method according (1), the first state has two or more states.

(11) In the control method according to (1), a value of the source power of the second state is 0.

(12) In the control method according to (1), the reference electrical state is a state of a signal synchronized with a cycle of a radio frequency of the bias power, or a voltage, current or electromagnetic field measured in any one of members from the first electrode to the inside of the matching unit connected via the power feeding rod of the bias power in the power feeding system of the bias power.

(13) A plasma processing apparatus includes: a first electrode configured to place a workpiece thereon; a plasma generation source configured to generate plasma; a bias power supply configured to supply a bias power to the first electrode; a source power supply configured to supply a source power having a frequency higher than that of the bias power to the plasma generation source; and a controller configured to control the bias power supply and the source power supply. The source power has a first state and a second state, and the controller performs a control to alternately apply the first state and the second state of the source power in synchronization with a signal synchronized with a cycle of a radio frequency of the bias power, or a phase within one cycle of a reference electrical state that represents any one of a voltage, current, and electromagnetic field measured in a power feeding system of the bias power.

(14) A plasma processing apparatus includes: a first electrode configured to place a workpiece thereon; a second electrode that faces the first electrode; a bias power supply configured to supply a bias power to the first electrode; a source power supply configured to supply a source power having a frequency higher than that of the bias power to the first electrode or the second electrode; and a controller configured to control the bias power supply and the source power supply. The source power has a first state and a second state, and the controller performs a control to alternately apply the first state and the second state of the source power in synchronization with a signal synchronized with a cycle of a radio frequency of the bias power, or a phase within one cycle of a reference electrical state that represents any one of a voltage, current, and electromagnetic field measured in a power feeding system of the bias power.

(15) In the plasma processing apparatus according to (13), the controller creates a synchronization signal that is synchronized with the phase of the reference electrical state, generates a source power supply control signal for outputting the source power from the synchronization signal, and transmits the generated control signal to the source power supply.

(16) In the plasma processing apparatus according to (13), an additional circuit including at least one element of a coil, a variable capacitor, and a diode is attached to a supply line of the bias power or the source power, or the first electrode.

(17) In the plasma processing apparatus according to (13), an impedance variation circuit of which impedance is changeable is attached to a power feeding line of the bias power or the source power, or the first electrode, and the controller changes the impedance of the impedance variation circuit.

(18) The plasma processing apparatus according to (13) further includes: a magnetic field generator configured to apply a magnetic field. The controller controls an intensity of the magnetic field generated by the magnetic field generator, according to the bias power, the phase of the reference electrical state, the potential of the first electrode to which the bias power is applied, a self-bias, or a measured reflected wave power of the source power.

(19) In the plasma processing apparatus according to (13), the source power supply is a frequency variable power supply, and the controller changes the frequency of the source power output from the source power supply according to the phase of the reference electrical state.

(20) A control method of a plasma processing apparatus including a first electrode that places a workpiece thereon, the control method includes: supplying a bias power to the first electrode; and supplying a source power having a frequency higher than that of the bias power into a plasma processing space, wherein the source power has a first state and a second state, and the control method further comprises a first control process of controlling the first state and the second state of the source power with two or more frequencies according to each phase obtained by dividing a signal synchronized with a cycle of a radio frequency of the bias power, or a phase within one cycle of a reference electrical state that represents any one of a voltage, current, and electromagnetic field measured in a power feeding system of the bias power.

DESCRIPTION OF SYMBOLS

| 1: | plasma processing apparatus | 10: | processing container |
|---|---|---|---|
| 16: | stage (lower electrode) | 34: | upper electrode |
| 47: | power feeding rod | 46: | matching unit |
| 48: | first radio-frequency power supply | 50: | variable DC power supply |
| 66: | processing gas source | 84: | exhaust device |
| 88: | matching unit | 89: | power feeding rod |
| 90: | second radio-frequency power supply | 91: | GND block |
| 100: | processor | 102: | signal generation circuit |
| 105, 108: | directional coupler | 111: | reflection detector |
| 112: | oscilloscope | 200: | controller |
| 250: | additional circuit | 300: | impedance variation circuit |
| 350: | electromagnet | | |

What is claimed is:

1. A plasma processing apparatus comprising:
an electrode;
a low frequency (LF) radio frequency (RF) power supply configured to generate LF power at a first radio frequency (RF) frequency, a waveform of the first RF frequency having a cycle, a first half-cycle of the waveform being separated from a second half cycle of the waveform at a zero-crossing;
a high frequency (HF) RF power supply configured to generate HF power at a changeable RF frequency that is higher in frequency than the first RF frequency, the LF power and the HF power being applied to the electrode; and
a controller configured to control the HF RF power supply to provide the HF power at a first HF frequency during the first half-cycle of the waveform of first RF frequency, and provide the HF power at a second HF frequency during the second half-cycle of the waveform of the first RF frequency.

2. The plasma processing apparatus according to claim 1, wherein
the zero-crossing being at a mid-point of the cycle of the waveform of the first RF frequency,
the waveform having an initial zero-crossing at an initial portion of the cycle of the waveform, and
the waveform having an end zero-crossing at an end of the cycle of the waveform.

3. The plasma processing apparatus according to claim 1, further comprising:
impedance matching circuitry disposed in a power supply path between the LF RF power supply and the electrode and between the HF RF power supply and the electrode.

4. The plasma processing apparatus according to claim 3, wherein
the controller is configured to control the HF RF power supply to change the HF power from the first HF frequency during the first half-cycle to the second HF frequency during the second half-cycle of the waveform so as to assist the impedance matching circuitry in reducing a reflection of RF power supplied to the electrode.

5. The plasma processing apparatus according to claim 3, further comprising:
a voltage sensor that detects an output voltage of the impedance matching circuitry.

6. The plasma processing apparatus according to claim 1, wherein
a frequency of the waveform of the first RF frequency is in an inclusive range of 200 kHz through 13.56 MHz.

7. The plasma processing apparatus according to claim 6, wherein
the frequency of the waveform of the first RF frequency is in an inclusive range of 200 kHz and 400 kHz.

8. The plasma processing apparatus according to claim 1, wherein
a minimum frequency of the changeable RF frequency is at least 13.56 MHz.

9. The plasma processing apparatus according to claim 1, wherein
the LF RF power supply generates the LF power at a higher level than the HF power generated by the HF RF power supply.

10. The plasma processing apparatus according to claim 1, wherein
the controller is further configured to progressively change the second HF frequency during the second half-cycle.

11. The plasma processing apparatus according to claim 10, wherein
the controller is further configured to maintain the first HF frequency constant during the first half-cycle but progressively change the second HF frequency during the second half-cycle.

12. The plasma processing apparatus according to claim 1, wherein
the controller is further configured to progressively increase the second HF frequency during a first portion of the second half-cycle and decrease the second HF frequency during a second portion of the second half-cycle, the second portion of the second half-cycle being later in time than the first portion of the second half-cycle.

13. A controller in a plasma processing apparatus comprising:
circuitry configured to
control a low frequency (LF) radio frequency (RF) power supply to generate LF power at a first radio frequency (RF) frequency, a waveform of the first RF frequency having a cycle, a first half-cycle of the waveform being separated from a second half cycle of the waveform at a zero-crossing;
control a high frequency (HF) RF power supply to generate HF power at a changeable RF frequency that is higher in frequency than the first RF frequency, the LF power and the HF power being applied to an electrode in the plasma processing apparatus; and
control the HF RF power supply to provide the HF power at a first HF frequency during the first half-cycle of the waveform of first RF frequency, and provide the HF power at a second HF frequency during the second half-cycle of the waveform of the first RF frequency.

14. The controller according to claim 13, wherein
the zero-crossing being at a mid-point of the cycle of the waveform of the first RF frequency,
the waveform having an initial zero-crossing at an initial portion of the cycle of the waveform, and
the waveform having an end zero-crossing at an end of the cycle of the waveform.

15. The controller according to claim 13, wherein:
the circuitry is configured to control the HF RF power supply to change the HF power from the first HF frequency during the first half-cycle to the second HF frequency during the second half-cycle of the waveform so as to assist an impedance matching circuitry in reducing a reflection of RF power supplied to the electrode.

16. The controller according to claim 13, wherein
the circuitry is configured to control a frequency of the waveform of the first RF frequency to be in an inclusive range of 200 kHz through 13.56 MHz.

17. The controller according to claim 16, wherein
the circuitry is configured to control the frequency of the waveform of the first RF frequency to be in an inclusive range of 200 kHz and 400 kHz.

18. The controller according to claim 13, wherein
the circuitry is configured to control a minimum frequency of the changeable RF frequency to be at least 13.56 MHz.

19. The controller according to claim 13, wherein
the circuitry is configured to control the LF RF power supply to generate the LF power at a higher level than the HF power generated by the HF RF power supply.

20. The controller according to claim 13, wherein
the circuitry is further configured to progressively change the second HF frequency during the second half-cycle.

21. The controller according to claim 20, wherein
the circuitry is further configured to maintain the first HF frequency constant during the first half-cycle but progressively change the second HF frequency during the second half-cycle.

22. The controller according to claim 13, wherein
the circuitry is further configured to progressively increase the second HF frequency during a first portion of the second half-cycle and decrease the second HF frequency during a second portion of the second half-cycle, the second portion of the second half-cycle being later in time than the first portion of the second half-cycle.

23. A method for controlling a plasma processing apparatus comprising:
generating, with a low frequency (LF) radio frequency (RF) power supply, LF power at a first radio frequency (RF) frequency, a waveform of the first RF frequency having a cycle, a first half-cycle of the waveform being separated from a second half cycle of the waveform at a zero-crossing;
generating, with a high frequency (HF) RF power supply, HF power at a changeable RF frequency that is higher in frequency than the first RF frequency, the LF power and the HF power being applied to an electrode in the plasma processing apparatus; and
controlling the HF RF power supply to provide the HF power at a first HF frequency during the first half-cycle of the waveform of first RF frequency, and provide the HF power at a second HF frequency during the second half-cycle of the waveform of the first RF frequency.

24. The method according to claim 23, wherein
the controlling includes controlling
a zero-crossing to be at a mid-point of the cycle of the waveform of the first RF frequency,
the waveform to have an initial zero-crossing at an initial portion of the cycle of the waveform, and
the waveform to have an end zero-crossing at an end of the cycle of the waveform.

25. The method according to claim 23, wherein:
the controlling includes controlling the HF RF power supply to change the HF power from the first HF frequency during the first half-cycle to the second HF frequency during the second half-cycle of the waveform so as to assist an impedance matching circuitry in reducing a reflection of RF power supplied to the electrode.

26. The method according to claim 23, wherein
the controlling includes controlling a frequency of the waveform of the first RF frequency to be in an inclusive range of 200 kHz through 13.56 MHz.

27. The method according to claim 26, wherein
the controlling includes controlling the frequency of the waveform of the first RF frequency to be in an inclusive range of 200 kHz and 400 kHz.

28. The method according to claim 23, wherein
the controlling includes controlling a minimum frequency of the changeable RF frequency to be at least 13.56 MHz.

29. The method according to claim 23, wherein
the controlling includes controlling the LF RF power supply to generate the LF power at a higher level than the HF power generated by the HF RF power supply.

30. The method according to claim 23, wherein the controlling includes progressively changing the second HF frequency during the second half-cycle.

31. The method according to claim 30, wherein the controlling includes maintaining the first HF frequency constant during the first half-cycle but progressively change the second HF frequency during the second half-cycle.

32. The method according to claim 23, wherein the controlling includes progressively increasing the second HF frequency during a first portion of the second half-cycle and decreasing the second HF frequency during a second portion of the second half-cycle, the second portion of the second half-cycle being later in time than the first portion of the second half-cycle.

33. A non-transitory computer readable storage device having stored therein computer readable instructions that when executed by controller circuitry cause the controller circuitry to perform a control process in a plasma processing apparatus comprising:

generating, with a low frequency (LF) radio frequency (RF) power supply, LF power at a first radio frequency (RF) frequency, a waveform of the first RF frequency having a cycle, a first half-cycle of the waveform being separated from a second half cycle of the waveform at a zero-crossing;

generating, with a high frequency (HF) RF power supply, HF power at a changeable RF frequency that is higher in frequency than the first RF frequency, the LF power and the HF power being applied to an electrode in the plasma processing apparatus; and controlling the HF RF power supply to provide the HF power at a first HF frequency during the first half-cycle of the waveform of first RF frequency, and provide the HF power at a second HF frequency during the second half-cycle of the waveform of the first RF frequency.

* * * * *